(12) United States Patent
Kim

(10) Patent No.: US 11,056,500 B2
(45) Date of Patent: Jul. 6, 2021

(54) SEMICONDUCTOR MEMORY DEVICE

(71) Applicant: SK hynix Inc., Icheon-si (KR)

(72) Inventor: Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 16/681,326

(22) Filed: Nov. 12, 2019

(65) Prior Publication Data

US 2021/0028184 A1 Jan. 28, 2021

(30) Foreign Application Priority Data

Jul. 23, 2019 (KR) .................. 10-2019-0089112

(51) Int. Cl.
| | |
|---|---|
| *H01L 27/11573* | (2017.01) |
| *H01L 27/11524* | (2017.01) |
| *H01L 27/11556* | (2017.01) |
| *H01L 27/11519* | (2017.01) |
| *H01L 49/02* | (2006.01) |
| *H01L 27/1157* | (2017.01) |
| *H01L 27/11582* | (2017.01) |
| *H01L 27/11565* | (2017.01) |
| *H01L 27/11529* | (2017.01) |

(52) U.S. Cl.
CPC .... *H01L 27/11573* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11582* (2013.01); *H01L 28/92* (2013.01)

(58) Field of Classification Search
CPC ........ H01L 27/11573; H01L 27/11519; H01L 27/11556; H01L 27/11582; H01L 27/1157; H01L 27/11565; H01L 27/11524; H01L 27/11529; H01L 28/92
See application file for complete search history.

(56) References Cited

U.S. PATENT DOCUMENTS

| | | | |
|---|---|---|---|
| 7,663,175 B2 | 2/2010 | Komura et al. | |
| 9,659,954 B2* | 5/2017 | Kim | .............. H01L 28/91 |
| 10,629,675 B1* | 4/2020 | Nishikawa | ........ H01L 27/11519 |
| 2019/0067412 A1* | 2/2019 | Tessariol | ................ H01L 28/86 |

FOREIGN PATENT DOCUMENTS

| | | |
|---|---|---|
| KR | 1020130074358 A | 7/2013 |
| KR | 1020150026054 A | 3/2015 |

* cited by examiner

*Primary Examiner* — Allison Bernstein
(74) *Attorney, Agent, or Firm* — William Park & Associates Ltd.

(57) ABSTRACT

A semiconductor memory device includes a dielectric stack structure, and capacitor electrodes disposed in the dielectric stack structure.

20 Claims, 21 Drawing Sheets

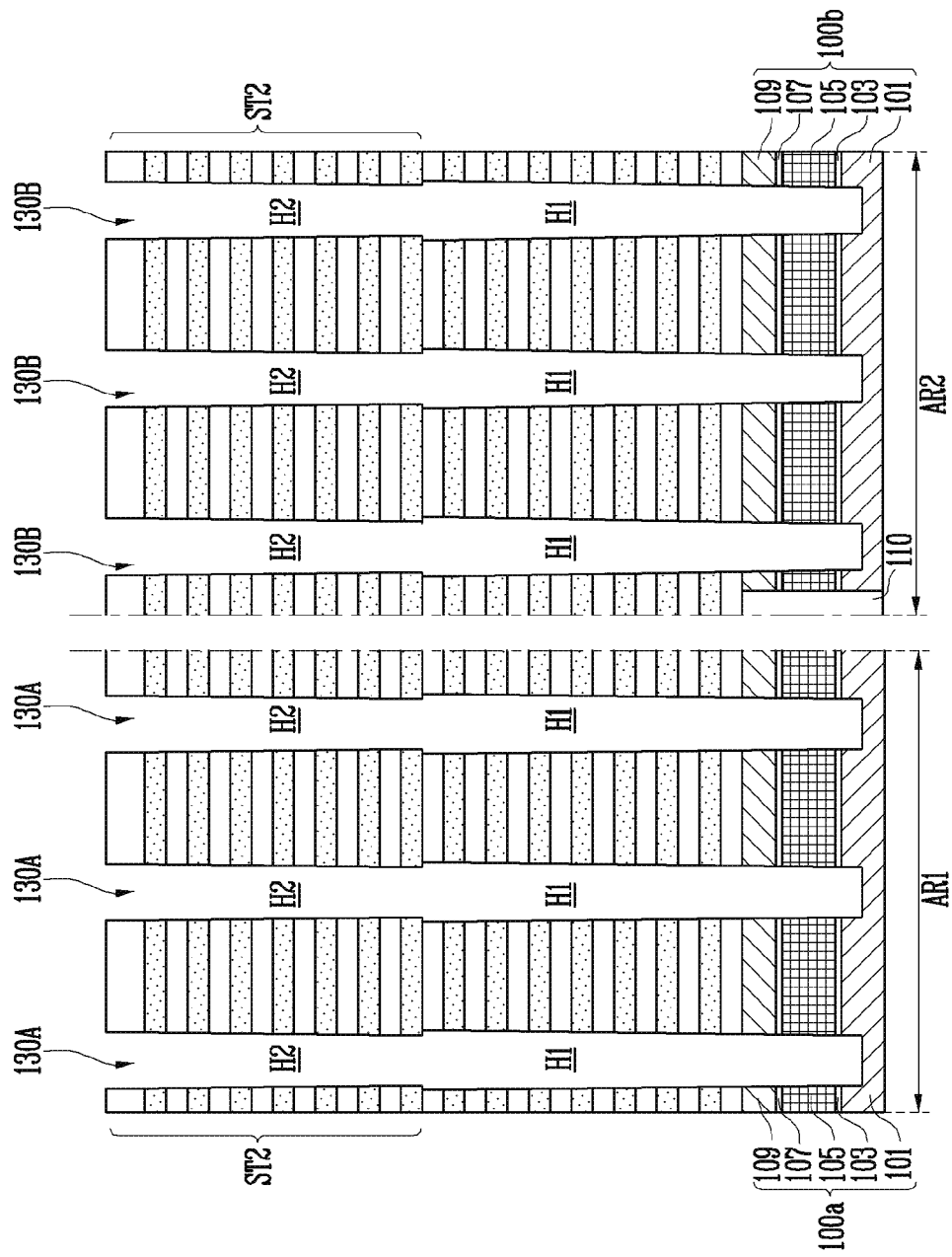

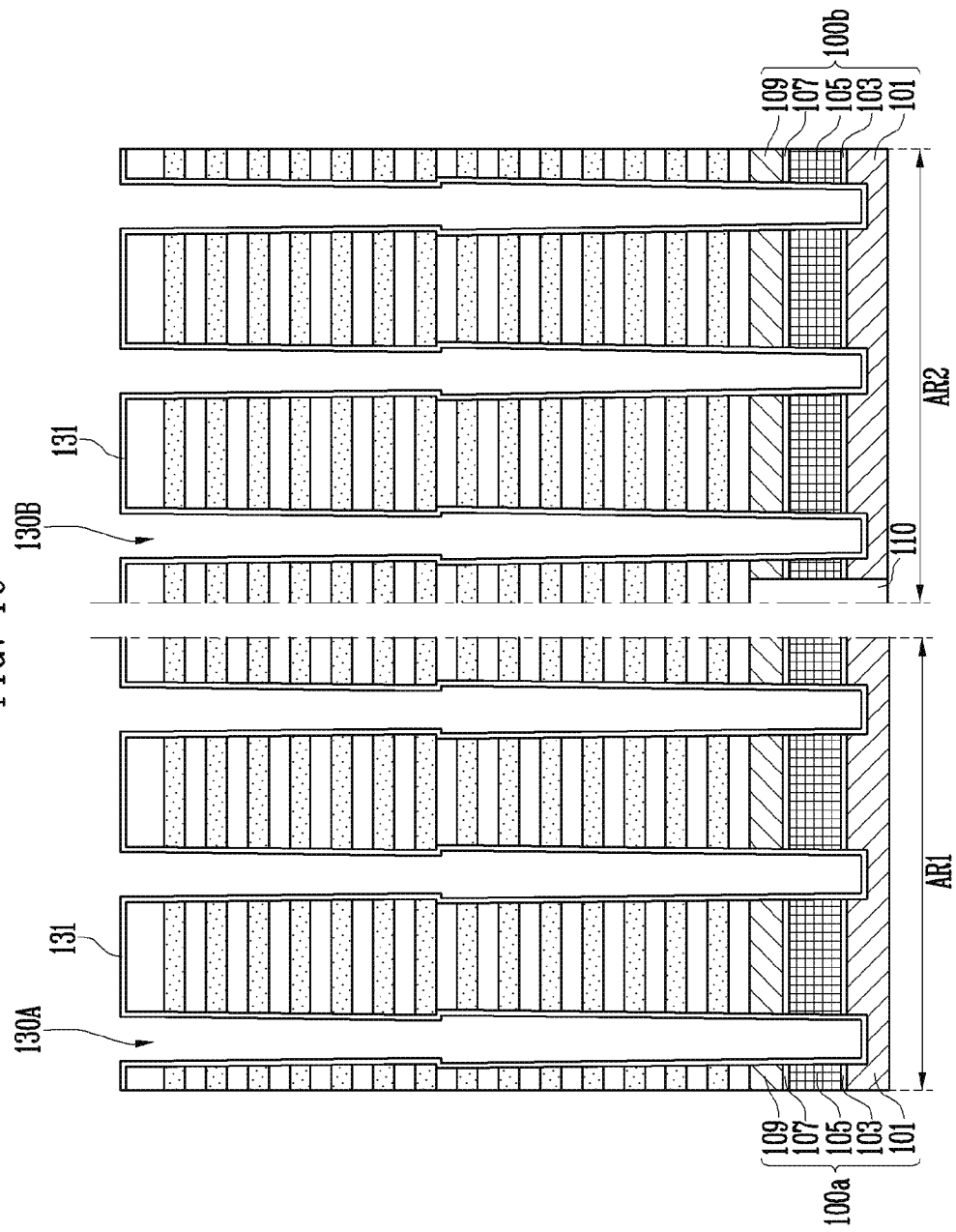

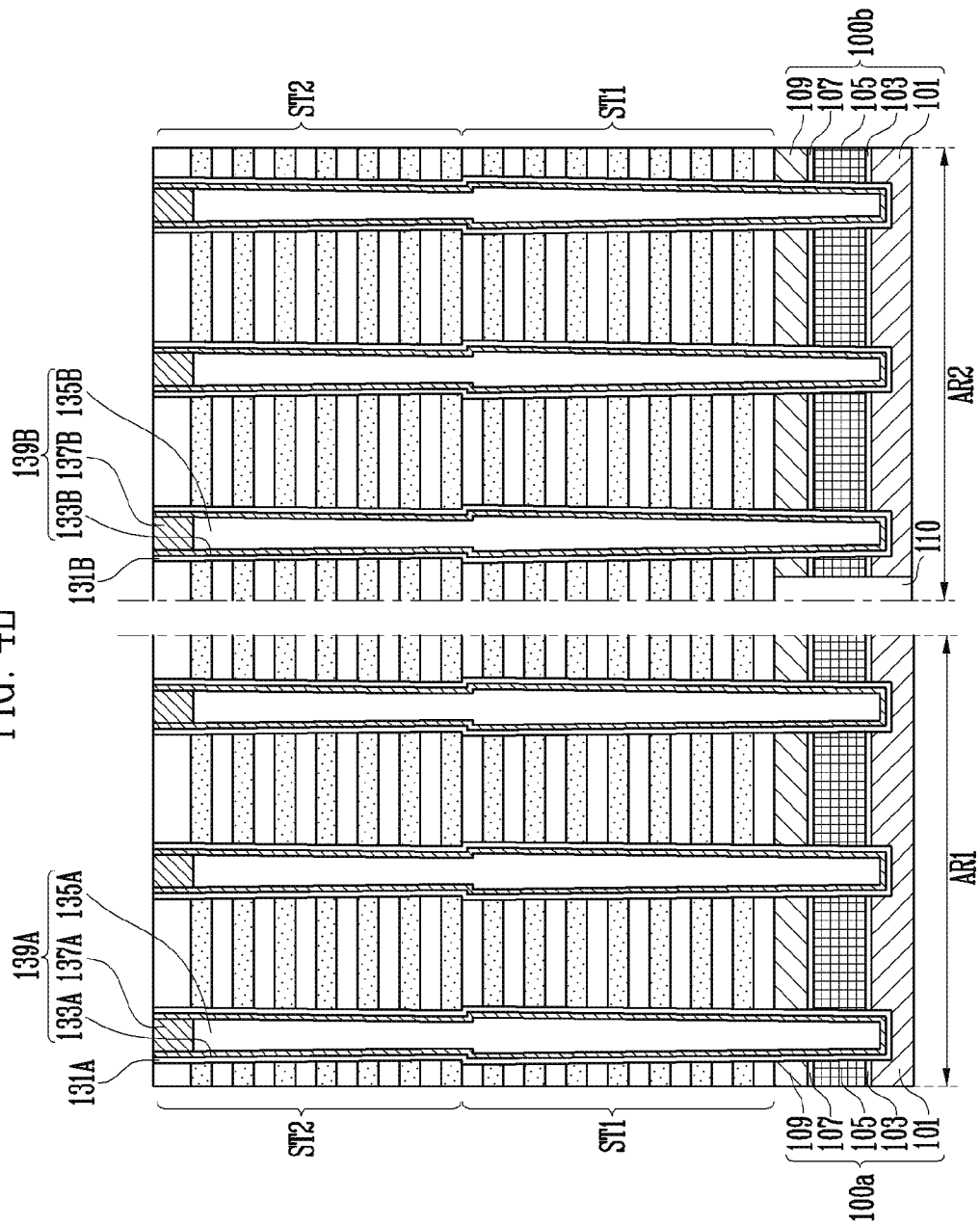

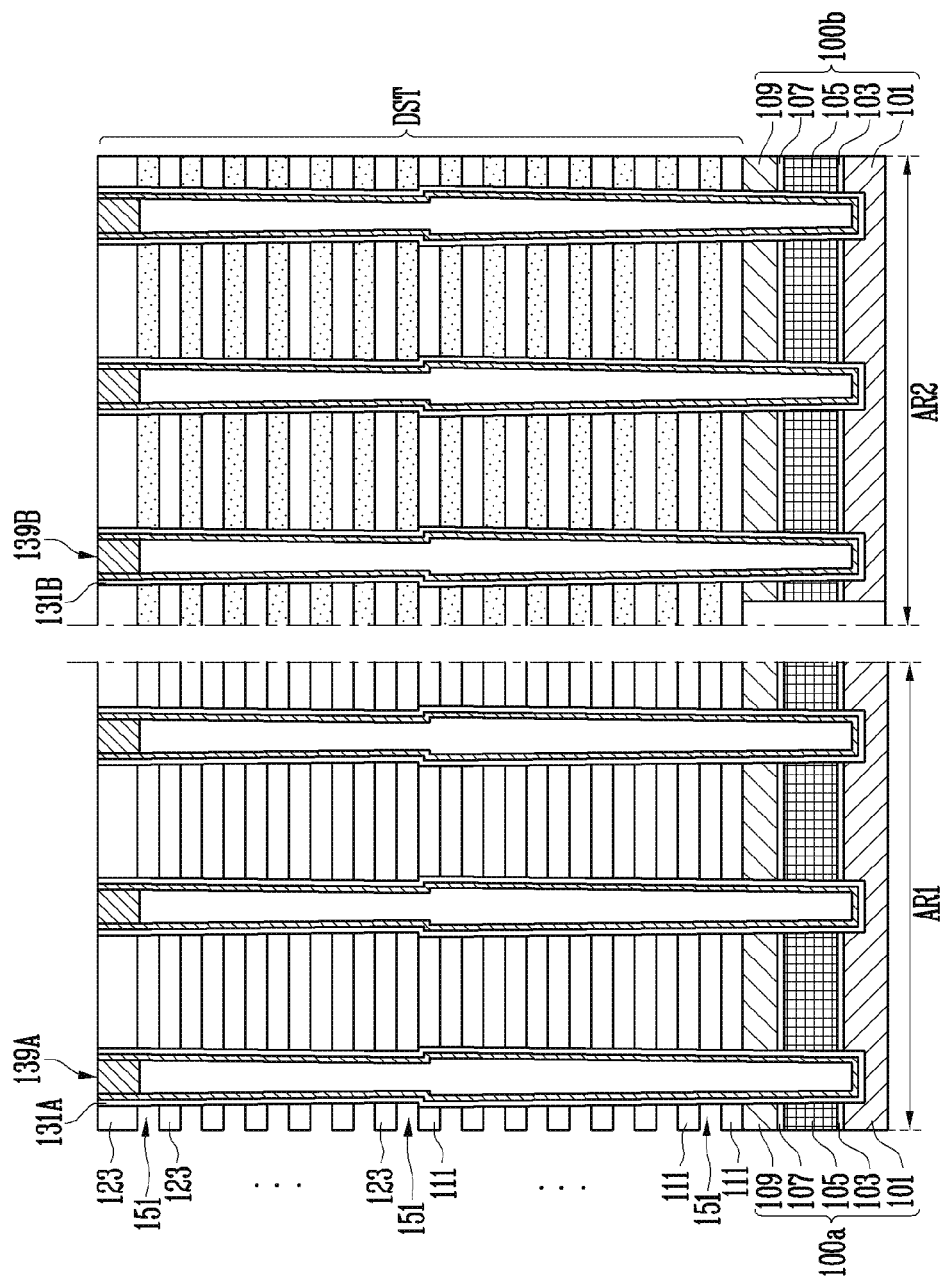

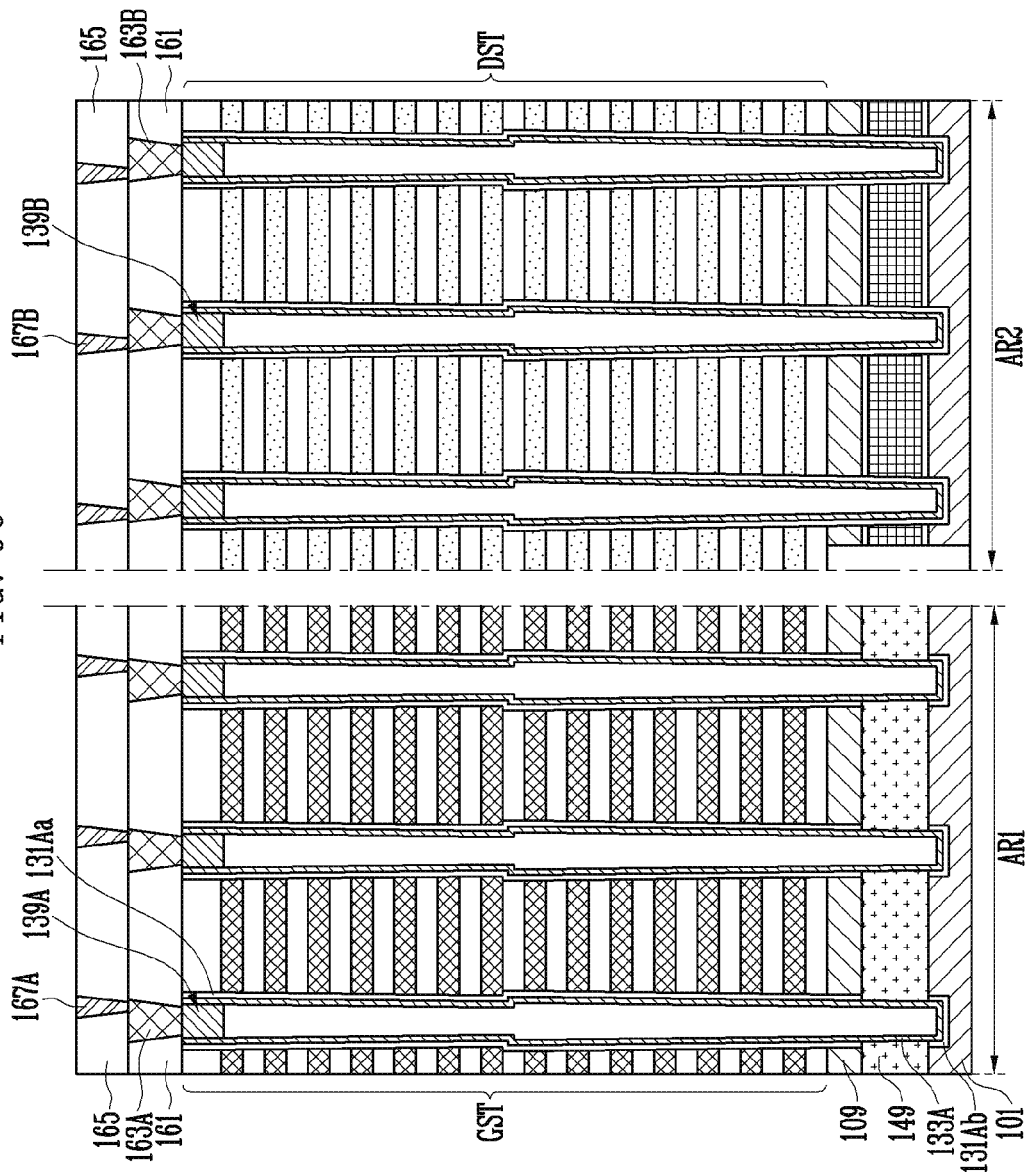

SEMICONDUCTOR MEMORY DEVICE

CROSS-REFERENCE TO RELATED APPLICATION

The present application claims priority under 35 U.S.C. § 119(a) to Korean patent application number 10-2019-0089112, filed on Jul. 23, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

In order to achieve a high degree of integration of semiconductor memory devices, a three-dimensional semiconductor memory device including three-dimensionally arranged memory cells has been proposed. The three-dimensional semiconductor memory device can increase the arrangement density of memory cells arranged in a limited area and decrease a chip size.

SUMMARY

In accordance with an aspect of the present disclosure, there is provided a semiconductor memory device including: a lower structure including a first region and a second region; a gate stack structure including interlayer insulating layers and conductive patterns, which are alternately stacked in a vertical direction on the first region of the lower structure; a channel structure penetrating the gate stack structure; a dielectric stack structure including first material layers and second material layers, which are alternately stacked in the vertical direction on the second region of the lower structure; and capacitor electrodes disposed in the dielectric stack structure, the capacitor electrodes extending substantially in parallel to the channel structure.

In accordance with another aspect of the present disclosure, there is provided a semiconductor memory device including: a first dielectric stack structure including first dummy insulating layers and first sacrificial insulating layers, which are alternately stacked in a vertical direction; a second dielectric stack structure including second dummy insulating layers and the second sacrificial insulating layers, which are alternately stacked in the vertical direction on the first dielectric stack structure; and capacitor electrodes extending in the vertical direction to penetrate the second dielectric stack.

BRIEF DESCRIPTION OF THE DRAWINGS

FIGS. 4A to 4E, 5, and 6A to 6C are sectional views illustrating a manufacturing method of a semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor memory device including a capacitor and a manufacturing method thereof.

Figure 1:
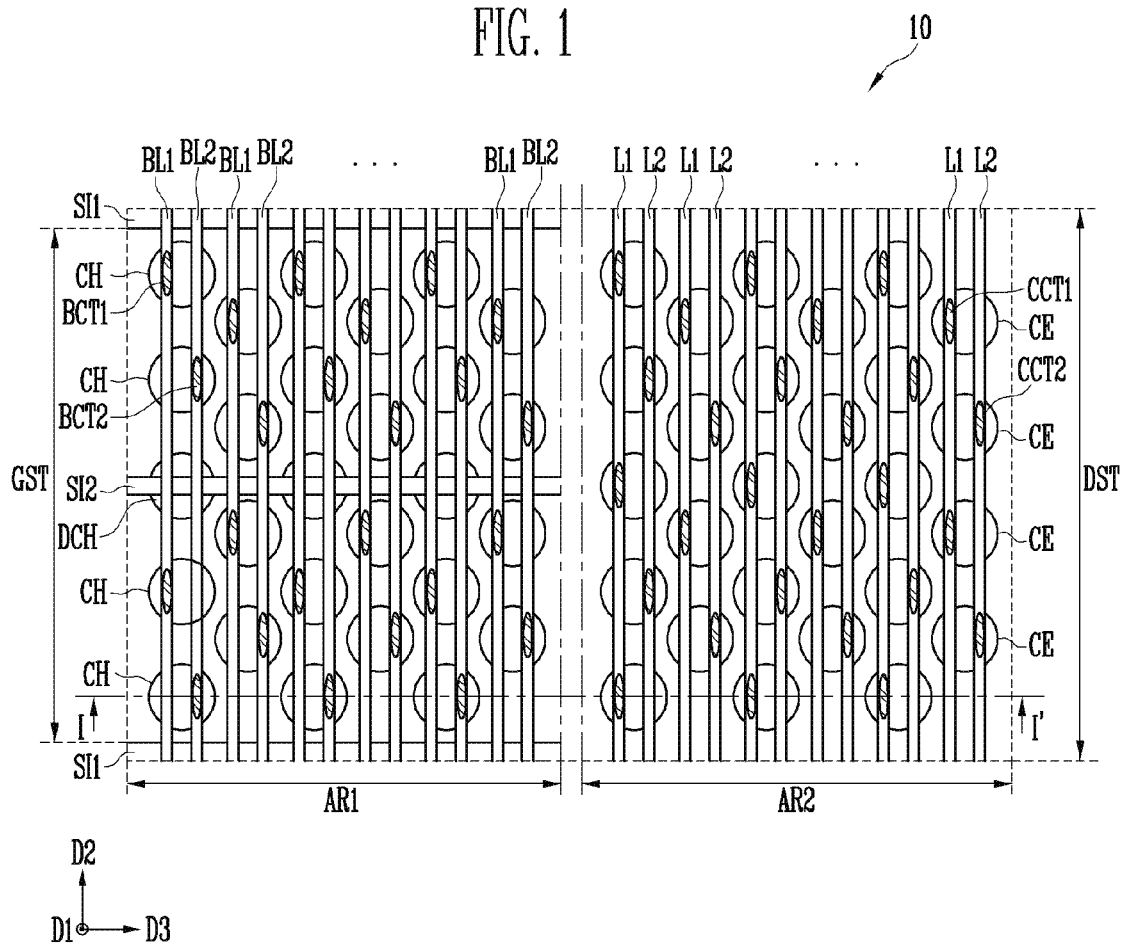
FIGS. 1 and 2 are plan views illustrating semiconductor memory devices in accordance with embodiments of the present disclosure.
Figure 2:
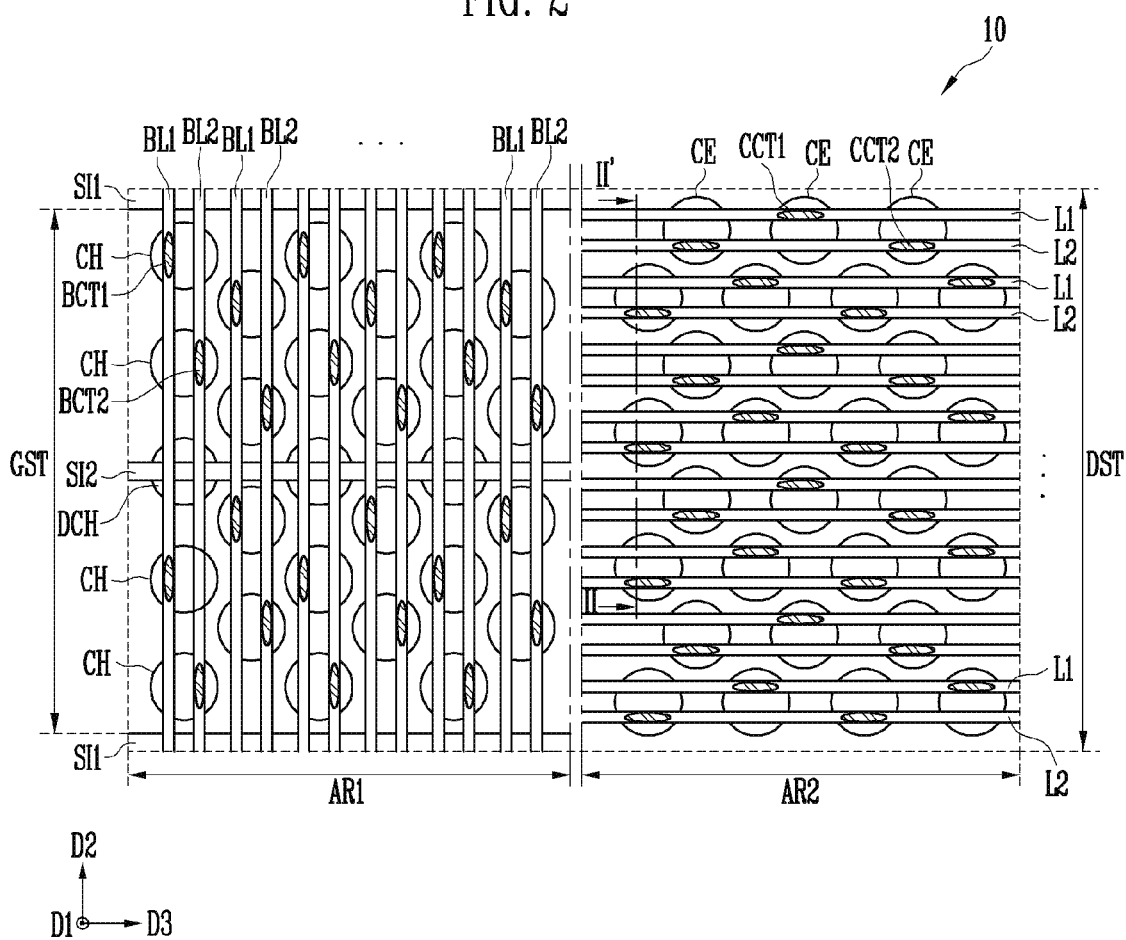

FIGS. 1 and 2 are plan views illustrating semiconductor memory devices in accordance with embodiments of the present disclosure.

Figure 3:
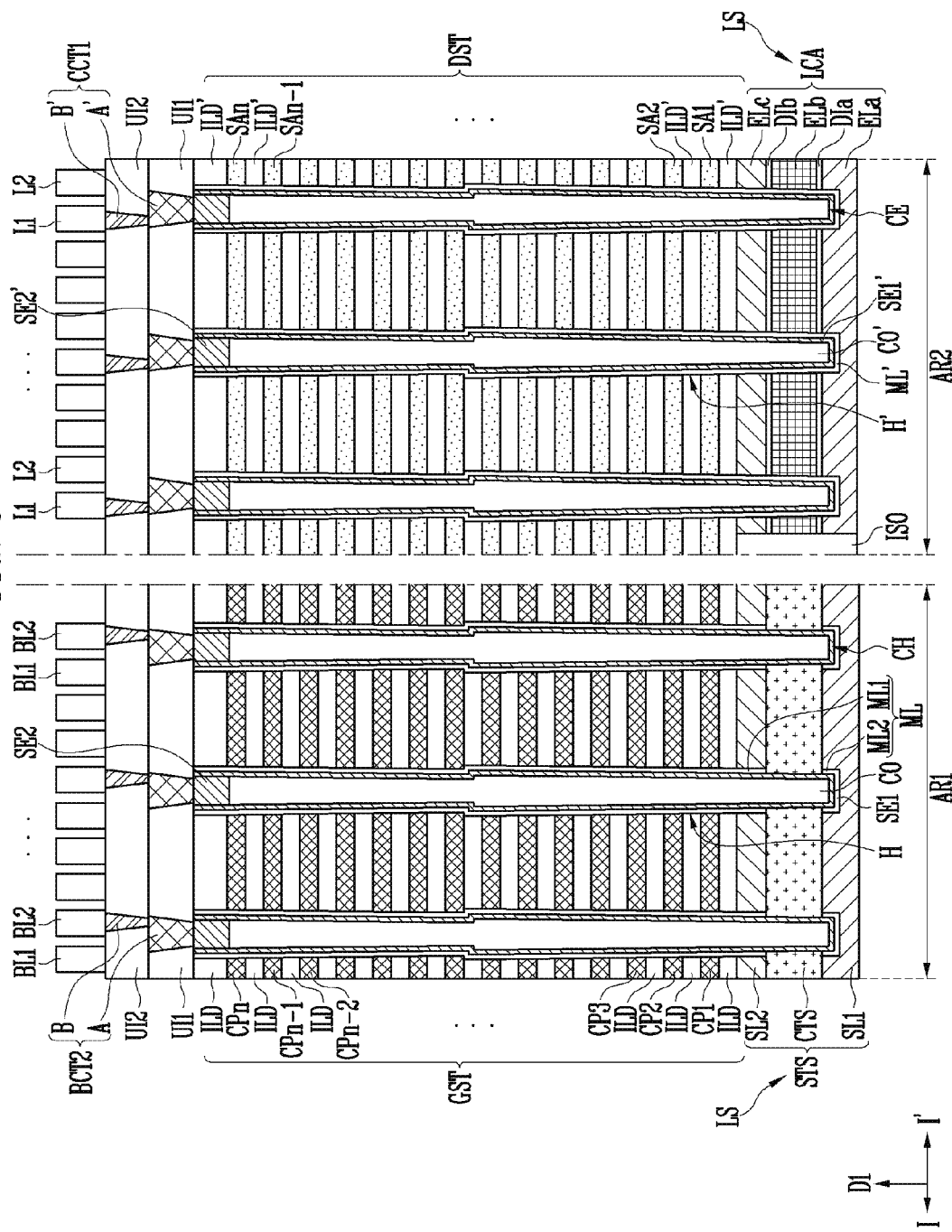
FIG. 3 is a sectional view illustrating an embodiment of a capacitor structure.

Referring to FIGS. 1 and 2, each semiconductor memory device 10 may include a gate stack structure GST and a dielectric stack structure DST, which are disposed on a lower structure LS shown in FIG. 3. The lower structure LS may include a first region AR1 and a second region AR2. The gate stack structure GST may be disposed on the first region AR1 of the lower structure LS, and the dielectric stack structure DST may be disposed on the second region AR2 of the lower structure LS.

The gate stack structure GST may be penetrated by channel structures CH extending in a vertical direction D1. The channel structures CH may be arranged in a column direction D2 and a row direction D3 on a plane orthogonal to the vertical direction D1. Channel structures CH disposed in a line in the column direction D2 may constitute a channel column, and channel structures CH disposed in a line in the row direction D3 may constitute a channel row. The channel structures CH may include a plurality of channel columns and a plurality of channel rows. In order to improve the degree of integration of the semiconductor memory device, the channel structures CH may be arranged in a zigzag pattern. However, the present disclosure is not limited thereto. For example, arrangements of the channel structures CH may be identical to each other on adjacent channel columns.

The channel structures CH may overlap with bit lines BL1 and BL2. The channel structures CH may be connected to the bit lines BL1 and BL2 through bit contact structures BCT1 and BCT2 extending toward the bit lines BL1 and BL2 from the channel structures CH.

The bit lines BL1 and BL2 may extend in one direction on the plane orthogonal to the vertical direction D1. In an embodiment, each of the bit lines BL1 and BL2 may extend in the column direction D2. The bit lines BL1 and BL2 may include first bit lines BL1 and second bit lines BL2, which are alternately disposed in one direction on the plane orthogonal to the vertical direction D1. For example, the first bit lines BL1 and the second bit lines BL2 may be alternately disposed in the row direction D3. The first bit lines BL1 and the second bit lines BL2 may overlap with the channel columns. In an embodiment, a pair of first and second bit lines BL1 and BL2 may overlap with the same channel column. The first bit line BL1 may be connected to an odd-numbered channel structure among a line of channel structures arranged in the column direction D2, and the second bit line BL2 may be connected to an even-numbered channel structure among the line of channel structures arranged in the column direction D2. The bit contact structure BCT1 and BCT2 may include a first bit contact structure BCT1 connecting the first bit line BL1 and the odd-numbered channel structure and a second bit contact structure BCT2 connecting the second bit line BL2 and the even-numbered channel structure. The first and second bit contact structures BCT1 and BCT2 may be disposed in zigzag.

The present disclosure is not limited to the example in which the pair of first and second bit lines BL1 and BL2 overlap with each other on the same channel row. For example, the first bit lines BL1 and the second bit lines BL2 may respectively overlap with different channel columns.

An edge of the gate stack structure GST may be defined along a first slit SI1. The first slit SI1 may extend in a direction intersecting the first and second bit lines BL1 and BL2. For example, the first slit SI1 may extend in the row direction D3.

A portion of the gate stack structure GST may be penetrated by a second slit SI2. The second silt SI2 may penetrate an upper portion of the gate stack structure GST, and be formed shorter than the first slit SI1 in the vertical direction D1. The second slit SI2 may extend in a direction intersecting the first and second bit lines BL1 and BL2. For example, the second slit SI2 may extend in the row direction D3. The channel structures CH may be disposed at both sides of the second slit SI2. The second slit SI2 may overlap with dummy channel structures DCH. The dummy channel structures DCH may extend in the vertical direction D1. In another embodiment, the dummy channel structures DCH may be omitted.

The dielectric stack structure DST may surround capacitor electrodes CE extending in the vertical direction D1. The capacitor electrodes CE may be arranged along the column direction D2 and the row direction D3 on the plane orthogonal to the vertical direction D1. Capacitor electrodes CE disposed in a line in the column direction D2 may constitute an electrode column, and capacitor electrodes CE disposed in a line in the row direction D3 may constitute an electrode row. The capacitor electrodes CE may include a plurality of electrode columns and a plurality of electrode rows. The capacitor electrodes CE may be arranged in a zigzag pattern. However, the present disclosure is not limited thereto. For example, arrangements of the capacitor electrodes CE may be identical to each other on adjacent electrode columns.

The capacitor electrodes CE may overlap with electrode lines L1 and L2. The capacitor electrodes CE may be connected to the electrode lines L1 and L2 through capacitor contact structures CCT1 and CCT2 extending toward the electrode lines L1 and L2 from the capacitor electrodes CE.

The electrode lines L1 and L2 may extend along one direction on the plane orthogonal to the vertical direction D1.

In an embodiment, as shown in FIG. 1, each of the electrode lines L1 and L2 may extend in the same direction as the extending direction of the bit lines BL1 and BL2. For example, the electrode lines L1 and L2 may extend in the column direction D2. The electrode lines L1 and L2 extending in the column direction D2 may include first electrode lines L1 and second electrode lines L2, which are alternately disposed in the row direction D3. The first electrode lines L1 and the second electrode lines L2 may overlap with the electrode columns. In an embodiment, a pair of first and second electrode lines L1 and L2 may overlap with the same electrode column.

In another embodiment, as shown in FIG. 2, each of the electrode lines L1 and L2 may extend in a direction different from the extending direction of the bit lines BL1 and BL2. For example, the electrode lines L1 and L2 may extend in the row direction D3. The electrode lines L1 and L2 extending in the row direction D3 may include first electrode lines L1 and second electrode lines L2, which are alternately disposed in the column direction D2. The first electrode lines L1 and the second electrode lines L2 may overlap with the electrode rows. In an embodiment, a pair of first and second electrode lines L1 and L2 may overlap with the same electrode row.

Again, referring to FIGS. 1 and 2, a first electrode line L1 may be connected to an odd-numbered capacitor electrode among a line of capacitor electrodes CE arranged along the extending direction thereof, and be connected to an even-numbered capacitor electrode among the line of capacitor electrodes CE arranged along the extending direction thereof. The capacitor contact structures CCT1 and CCT2 may include a first capacitor contact structure CCT1 connecting a first electrode line L1 and an odd-numbered capacitor electrode and a second capacitor contact structure CCT2 connecting a second electrode line L2 and an even-numbered capacitor electrode. The first capacitor contact structure CCT1 and the second capacitor contact structure CCT2 may be disposed in a zigzag pattern.

The present disclosure is not limited to the example in which the pair of first and second electrode lines L1 and L2 overlap with each other on the same electrode column or the same electrode row. For example, the first electrode lines L1 and the second electrode lines L2 may respectively overlap with different channel columns, or respectively overlap with different electrode rows.

A capacitor structure may be implemented by the capacitor electrodes CE and the dielectric stack structure DST disposed between the capacitor electrodes CE. In an operation of the semiconductor memory device, a voltage applied to each of the first electrode lines L1 and a voltage applied to each of the second electrode lines L2 may be differently controlled to accumulate charges in the capacitor structure. For example, a first voltage may be applied to the first electrode lines L1, and a second voltage lower than the first voltage may be applied to the second electrode lines L2. An upper capacitor structure may be defined between each of the first electrode lines L1 and a second electrode line L2 adjacent thereto.

FIG. 3 is a sectional view illustrating an embodiment of a capacitor structure. FIG. 3 illustrates a section of the semiconductor memory device taken along line I-I' shown in FIG. 1.

Referring to FIG. 3, the dummy stack structure DST may be disposed in parallel to the gate stack structure GST. The dummy stack structure DST and the gate stack structure GST may be disposed on the lower structure LS. The lower structure LS may include a semiconductor stack structure STS disposed in the first region AR1 and a lower capacitor structure LCA disposed in the second region AR2 while being spaced apart from the semiconductor stack structure STS. The semiconductor stack structure STS and the lower capacitor structure LCA may be separated from each other by an isolation insulating layer ISO, to be individually controlled.

In an embodiment, the semiconductor structure STS may include a first lower semiconductor layer SL1, a contact semiconductor layer CTS, and a second lower semiconductor layer SL2, which are sequentially stacked in the vertical direction D1. In another embodiment, the second lower semiconductor layer SL2 may be omitted. The first lower semiconductor layer SL1 may include a doped semiconductor layer including a conductivity type impurity or include an undoped semiconductor layer. The first lower semiconductor layer SL1 as the doped semiconductor layer may include an n-type impurity or p-type impurity. The contact semiconductor layer CTS is a source region connected to a source line (not shown), and may include a source dopant. The source dopant may include an n-type impurity. The second lower semiconductor layer SL2 may include a doped semiconductor layer including a conductivity type dopant or include an undoped semiconductor layer. In an embodiment, each of the first lower semiconductor layer SL1, the contact semiconductor layer CTS, and the second lower semiconductor layer SL2 may include a doped silicon layer including an n-type impurity.

In an embodiment, the lower capacitor structure LCA may include a first lower electrode ELa, a first insulating layer DIa, a second lower electrode ELb, a second insulating layer DIb, and a third lower electrode ELc, which are sequentially stacked in the vertical direction D1. Each of the first lower electrode ELa, the second lower electrode ELb, and the third lower electrode ELc may include a doped semiconductor layer including a conductivity type impurity or include an undoped semiconductor layer. The doped semiconductor layer may include an n-type impurity or p-type impurity. In another embodiment, the third lower electrode ELc may be omitted. The first lower electrode ELa and the first lower semiconductor layer SL1 may be patterns separated from the same semiconductor layer, and the third lower electrode ELc and the second lower semiconductor layer SL2 may be patterns separated from the same semiconductor layer. In an embodiment, the first lower electrode ELa and the third lower electrode ELc may include a silicon layer including an n-type impurity. Each of the first insulating layer DIa and the second insulating layer DIb may include oxide.

The gate stack structure GST may overlap with the semiconductor stack structure STS. The gate stack structure GST may include interlayer insulating layers ILD and conductive patterns CP1 to CPn, which are alternately stacked in the vertical direction D1. Each of the conductive patterns CP1 to CPn may include various conductive materials such as a doped silicon layer, a metal layer, a metal silicide layer, and a barrier layer, and include two or more conductive materials. For example, each of the conductive patterns CP1 to CPn may include tungsten and a titanium nitride layer (TiN) surrounding the surface of the tungsten. The tungsten is a low-resistance metal, and may decrease resistance of the conductive patterns CP1 to CPn. The titanium nitride layer (TiN) is a barrier layer, and may prevent direct contact between the tungsten and the interlayer insulating layers ILD.

The conductive patterns CP1 to CPn may be used as source select lines, word lines, and drain select lines. For example, a first conductive pattern CP1 disposed closest to the semiconductor stack structure STS among the conductive patterns CP1 to CPn may be used as a source select line. An nth conductive pattern CPn disposed closest to the bit lines BL1 and BL2 among the conductive patterns CP1 to CPn may be used as a drain select line. However, the present disclosure is not limited thereto. For example, at least one conductive pattern (e.g., CP2) consecutively stacked in the vertical direction D1 on the first conductive pattern CP1 may be used as another source select line. In addition, at least one conductive pattern (e.g., CPn−1) consecutively disposed under the nth conductive pattern CPn may be used as another drain select line. Intermediate conductive patterns (e.g., CP3 to CPn−2) disposed between the source select line and the drain select line among the conductive patterns CP1 to CPn may be used as word lines.

The source select line is used as a gate of a source select transistor corresponding thereto, the drain select line is used as a gate of a drain select transistor corresponding thereto, and each of the word lines is used as a gate of a memory cell corresponding thereto.

The gate stack structure GST may be penetrated by the channel structures CH extending in the vertical direction D1 from the semiconductor stack structure STS. Each of the channel structures CH may include a semiconductor layer. In an embodiment, the channel structure CH may include a first channel semiconductor layer SE1 formed along a surface of a channel hole H penetrating the gate stack structure GST, a channel core insulating layer CO filling a central region of the channel hole H, which is opened by the first channel semiconductor layer SE1, and a second channel semiconductor layer SE2 filling the central region of the channel hole H on the channel core insulating layer CO. However, the present disclosure is not limited thereto. For example, each of the channel structures CH may include a channel semiconductor layer filling the central region of the channel hole H. Each of the channel holes H and the channel structures CH may extend to the inside of the semiconductor stack structure STS. In an embodiment, each of the channel holes H and the channel structures CH may penetrate the second lower semiconductor layer SL2 of the semiconductor stack structure STS, and extend to the inside of the first lower semiconductor layer SL1.

A sidewall of the channel structure CH may be surrounded by a memory layer ML. The memory layer ML may be penetrated by the contact semiconductor layer CTS. The contact semiconductor layer CTS may penetrate the memory layer ML and be in direct contact with the first channel semiconductor layer SE1 of the channel structure CH. The memory layer ML may be separated into a first memory pattern ML1 remaining on the top of the contact semiconductor layer CTS and a second memory pattern ML2 remaining on the bottom of the contact semiconductor layer CTS.

The channel structure CH may connect at least one source select transistor, a plurality of memory cells, and at least one drain select transistor in series to each other. The source select transistor may be defined at an intersection portion of the channel structure CH and a conductive pattern (e.g., CP1) used as a source select line, the drain select transistor may be defined at an intersection portion of the channel structure CH and a conductive pattern (e.g., CPn) used as a drain select line, and the memory cells may be defined at intersection portions of the channel structure CH and conductive patterns (e.g., CP3 to CPn−2) used as word lines.

The dielectric stack structure DST may include first material layers ILD' and second material layers SA1 to SAn, which are alternately stacked in the vertical direction D1. The first material layers ILD' and the second material layers SA1 to SAn may include an insulating material.

The first material layers ILD' of the dielectric stack structure DST may be formed of the same material as the interlayer insulating layers ILD of the gate stack structure GST. The first material layers ILD' may be disposed at the same levels as the interlayer insulating layers ILD.

The second material layers SA1 to SAn of the dielectric stack structure DST may including an insulating material having an etching rate different from that of the interlayer insulating layers ILD and the first material layers ILD'. For example, the interlayer insulating layers ILD and the first material layers ILD' may include silicon oxide, and the second material layers SA1 to SAn may include silicon nitride. The second material layers SA1 to SAn may be disposed at the same levels as the conductive patterns CP1 to CPn of the gate stack structure GST.

The dielectric stack structure DST may overlap with the lower capacitor structure LCA. The capacitor electrode CE may penetrate the dielectric stack structure DST and extend to the inside of the lower capacitor structure LCA. The capacitor electrode CE may extend in parallel to the channel structure CH. In an embodiment, the capacitor electrode CE may be disposed in an electrode hole H' that penetrates the dielectric stack structure DST and extend to the inside of the lower capacitor structure LCA. The electrode hole H' and the capacitor electrode CE may penetrate the third lower electrode ELc, the second insulating layer DIb, the second lower electrode ELb, and the first insulating layer DIa of the lower capacitor structure LCA, and extend to the inside of the first lower electrode ELa.

The capacitor electrode CE is surrounded by a dielectric film ML'. The dielectric film ML' may extend along a bottom surface and a sidewall of the capacitor electrode CE. A plurality of capacitor structures may be defined by the lower capacitor structure LCA and the dielectric film ML'. For example, capacitors may be defined between the first lower electrode ELa and the second lower electrode ELb of the lower capacitor structure LCA, between the second lower electrode ELb and the third lower electrode ELc of the lower capacitor structure LCA, and between the first to third lower electrodes ELa to ELc of the lower capacitor structure LCA.

In an operation of the semiconductor memory device, charges may be accumulated in a plurality of capacitors by differently controlling a voltage applied to the capacitor electrode CE and voltages applied to the first to third lower electrodes ELa to ELc.

In order to accumulate charges in a capacitor defined between adjacent first and second electrode lines L1 and L2, a first voltage may be applied to the first electrode lines L1, and a second voltage lower than the first voltage may be applied to the second electrode lines L2.

The capacitor electrode CE may include various conductive materials. For example, the capacitor electrode CE may include a semiconductor layer. In an embodiment, the capacitor electrode CE may include a first electrode semiconductor layer SE1' that is formed along a surface of the electrode hole H' and is formed on the dielectric film ML', an electrode core insulating layer CO' filling a central region of the electrode hole H, which is opened by the first electrode semiconductor layer SE1, and a second electrode semiconductor layer SE2' filling the central region of the electrode hole H' on the electrode core insulating layer CO'. However, the present disclosure is not limited thereto. For example, the capacitor electrode CE may include an electrode semiconductor layer filling the central region of the electrode hole H'.

Each of the first channel semiconductor layer SE1 and the first electrode semiconductor layer SE1' may include at least one of an undoped silicon layer and a doped silicon layer. Each of the second channel semiconductor layer SE2 and the second electrode semiconductor layer SE2' may include a doped silicon layer.

Each of the memory layer ML and the dielectric film ML' may include a tunnel insulating layer, a data storage layer extending along an outer wall of the tunnel insulating layer, and a blocking insulating layer extending along an outer wall of the data storage layer. The data storage layer may be formed of a material layer capable of storing data between the channel structure CH and the conductive patterns used as the word lines. For example, the data storage layer may be formed of a material layer capable of storing data changed using Fowler-Nordheim tunneling. To this end, the data storage layer may be formed of various materials. For example, the data storage layer may be formed of a nitride layer in which charges can be trapped. However, the embodiment of the present disclosure is not limited thereto, and the data storage layer may include silicon, a phase change material, nano dots, and the like. The blocking insulating layer may include an oxide layer capable of blocking charges. The tunnel insulating layer may be formed of a silicon oxide layer through which charges can tunnel.

The gate stack structure GST and the dielectric stack structure DST may be covered by one or more upper insulating layers UI1 and UI2. In an embodiment, the gate stack structure GST and the dielectric stack structure DST may be covered by a first upper insulating layer UI1 and a second upper insulating layer UI2 stacked on the first upper insulating layer UI1.

The upper insulating layers UI1 and UI2 may be penetrated by the bit contact structures BCT1 and BCT2 and the capacitor contact structure CCT1 and CCT2, which are shown in FIG. 1. FIG. 3 illustrates a section of the second bit contact structure BCT2 and the first capacitor contact structure CCT1, which are arranged along the line I-I'. A section of the first bit contact structure BCT1 and the second capacitor contact structure CCT2, which are shown in FIG. 1, may be identical to that of the second bit contact structure BCT2 and the first capacitor contact structure CCT1, which are shown in FIG. 3. Hereinafter, the second bit contact structure BCT2 shown in FIG. 3 is referred to as a bit contact structure, and the first capacitor contact structure CCT1 is referred to as a capacitor contact structure.

The bit contact structure BCT2 may include two or more channel connection patterns A and B that are stacked in the vertical direction D1 and are formed of a conductive material. For example, the bit contact structure BCT2 may include a channel connection pattern A penetrating the first upper insulating layer UI1 and a second channel connection pattern B penetrating the second upper insulating layer UI2. The first channel connection pattern A may extend toward the second channel connection pattern B from a channel structure CH corresponding thereto. The second channel connection pattern B may extend toward a bit line (e.g., BL2) corresponding thereto from the first channel connection pattern A.

The capacitor contact structure CCT1 may include two or more electrode connection patterns A' and B' that are stacked in the vertical direction D1 and are formed of a conductive material. For example, the capacitor contact structure CCT1 may include a first electrode connection pattern A' penetrating the first upper insulating layer UI1 and a second electrode connection pattern B' penetrating the second upper insulating layer UI2. The first electrode connection pattern A' may extend toward the second electrode connection pattern B' from a capacitor electrode CE corresponding thereto. The second electrode connection pattern B' may extend toward an electrode line (e.g., L1) corresponding thereto from the first electrode connection pattern A'. A capacitor structure may be defined between the first electrode connection pattern A' and another first electrode connection pattern A' adjacent thereto. A capacitor structure may be defined between the second electrode connection pattern B' and another second electrode connection pattern B' adjacent thereto.

In an embodiment, the electrode lines L1 and L2 may be disposed at the same level as the bit lines BL1 and BL2. In an embodiment, the electrode lines L1 and L2 may be formed of the same metal as the bit lines BL1 and BL2.

A section of the second region AR2 of the lower structure LS taken along line II-II' shown in FIG. 2 and a section of the capacitor electrodes CE overlapping therewith are the same as described with reference to FIG. 3, and therefore, overlapping descriptions will be omitted.

FIGS. 4A to 4E, 5, and 6A to 6C are sectional views illustrating a manufacturing method of a semiconductor memory device in accordance with an embodiment of the present disclosure. FIGS. 4A to 4E, 5, and 6A to 6C illustrate a manufacturing method of the semiconductor memory device shown in FIGS. 1 and 3. Hereinafter, contents overlapping with those described with reference to FIGS. 1 and 3 will be omitted.

FIGS. 4A to 4E are sectional views illustrating steps of a process of forming a channel structure and a capacitor electrode.

Figure 4A:
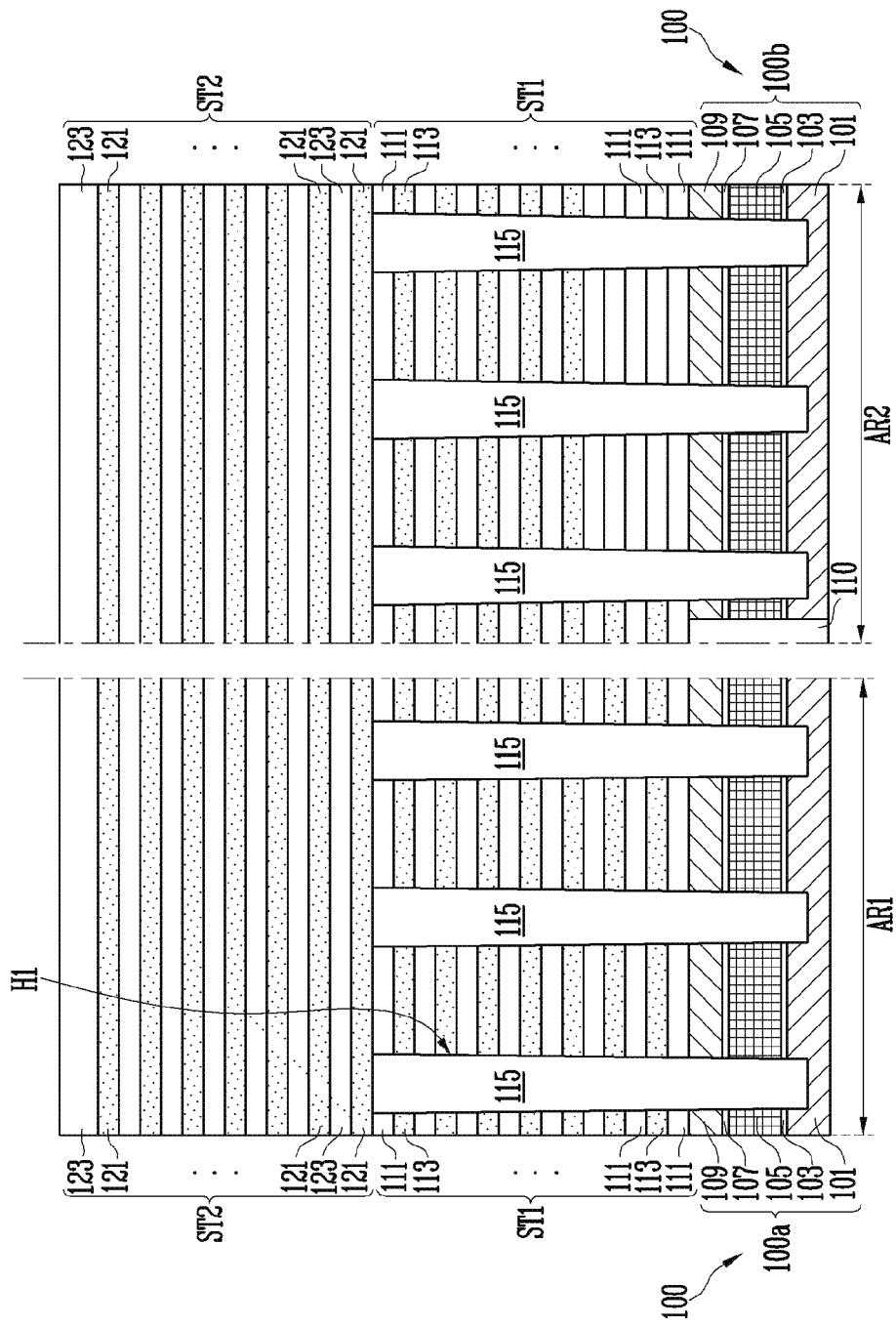

Referring to FIG. 4A, a first stack structure ST1 may be formed on a lower structure 100 including a first region AR1 and a second region AR2.

The lower structure 100 may include a first lower semiconductor layer 101, a first insulating layer 103, a sacrificial semiconductor layer 105, a second insulating layer 107, and a second lower semiconductor layer 109, which are sequentially stacked. In an embodiment, the second lower semiconductor layer 109 may be omitted. The lower structure 100 may be penetrated by an isolation insulating layer 110. The lower structure 100 may be separated into a first lower structure 100a and a second lower structure 100b by the isolation insulating layer 110.

Each of the first lower semiconductor layer 101 and the second lower semiconductor layer 109 may include a doped semiconductor layer including a conductivity type impurity, or include an undoped semiconductor layer. The doped semiconductor layer may include a p-type impurity or n-type impurity.

Each of the first insulating layer 103 and the second insulating layer 107 may include various insulating materials. For example, each of the first insulating layer 103 and the second insulating layer 107 may include oxide. The sacrificial semiconductor layer 105 may include silicon.

The first lower semiconductor layer 101 and the second lower semiconductor layer 109, which are disposed in the first region AR1 of the lower structure 100 and constitute the first lower structure 100a, may be used as the first and second lower semiconductor layers SL1 and SL2 of the semiconductor stack structure STS described with reference to FIG. 3. The first lower semiconductor layer 101, the sacrificial semiconductor layer 105, and the second lower semiconductor layer 109, which are disposed in the second region AR2 of the lower structure 100 and constitute the second lower structure 100b, may be used as the first lower electrode ELa, the second lower electrode ELb, and the third lower electrode ELc of the lower capacitor structure LCA described with reference to FIG. 3.

The first stack structure ST1 may be formed by alternately stacking first interlayer insulating layers 111 and first sacrificial insulating layers 113 on the lower structure 100. The first stack structure ST1 may extend to overlap with the first region AR1 and the second region AR2 of the lower structure 100.

After the first stack structure ST1 is formed, lower holes H1 penetrating the first stack structure ST1 may be formed. The lower holes H1 may extend to the inside of the first lower structure 100a and the second lower structure 100b. In an embodiment, the lower holes H1 may penetrate the second lower semiconductor layer 109, the second insulating layer 107, the sacrificial semiconductor layer 105, and the first insulating layer 103, and extend to the inside of the first lower semiconductor layer 101.

Subsequently, each of the lower holes H1 may be filled with a sacrificial material 115. Subsequently, second sacrificial insulating layers 121 and second interlayer insulating layers 123 may be alternately stacked on the first stack structure ST1 penetrated by the sacrificial material 115. Accordingly, a second stack structure ST2 overlapping with the first stack structure ST1 is formed.

The first interlayer insulating layers 111 of the first stack structure ST1 and the second interlayer insulating layer 123 of the second stack structure ST2 may be formed of a first material layer, and the first sacrificial insulating layers 113 of the first stack structure ST1 and the second sacrificial insulating layers 121 of the second stack structure ST2 may be formed of a second material layer. The second material layer may include a material having an etching rate different from that of the first material layer. For example, the first material may include oxide, and the second material layer may include nitride.

The sacrificial material 115 may include a material having an etching rate different from those of the first and second material layers. For example, the sacrificial material 115 may include a titanium nitride layer (TiN).

Referring to FIG. 4B, upper holes H2 may be formed, which penetrate the second stack structure ST2 and are respectively connected to the lower holes H1. Subsequently, the sacrificial material 115 described with reference to FIG. 4A may be selectively removed through the upper holes H2. Accordingly, the lower holes H1 are opened.

The lower holes H1 and the upper holes H2 may be divided into a plurality of pairs connected to each other. The lower holes H1 and the upper holes H2, which are divided into the plurality of pairs connected to each other, may be divided into a channel hole 130A extending to the inside of the first lower structure 100a and an electrode hole 130B extending to the inside of the second lower structure 100b.

Referring to FIG. 4C, a multi-layer 131 may be formed on a surface of each of the channel hole 130A and the electrode hole 130B. The multi-layer 131 may include a blocking insulating layer, a data storage layer, and a tunnel insulating layer, which are sequentially stacked on the surface of each of the channel hole 130A and the electrode hole 130B. The blocking insulating layer, the data storage layer, and the tunnel insulating layer may be made of the same materials as described with reference to FIG. 3.

Figure 4D:
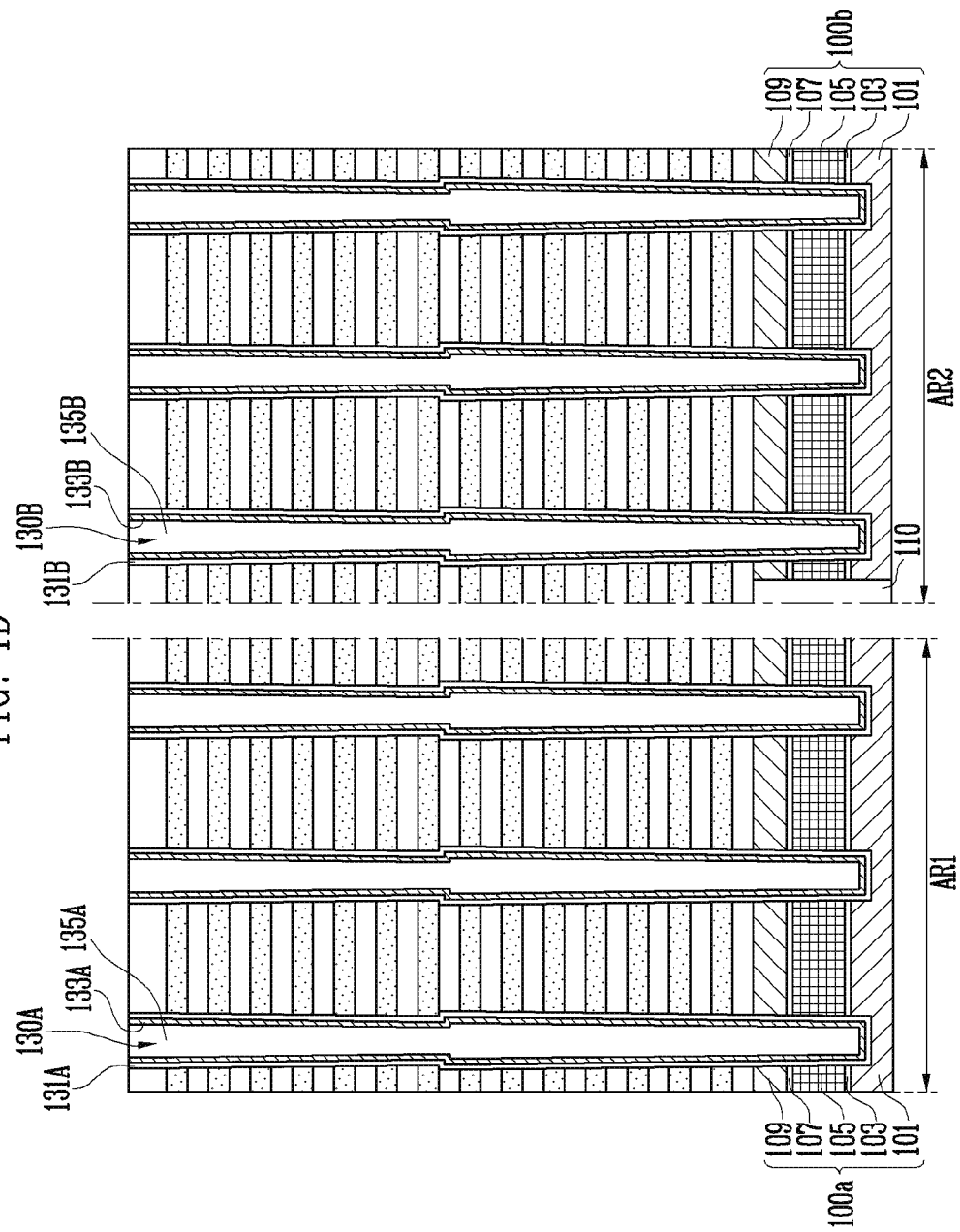

Referring to FIG. 4D, a first semiconductor layer extending along the surface of each of the channel hole 130A and the electrode hole 130B. In an embodiment, the first semiconductor layer may include silicon.

Subsequently, a central region of each of the channel hole 130A and the electrode hole 130B, which is opened by the first semiconductor layer, may be filled with an insulating material. Subsequently, a planarization process may be performed.

Through the above-described processes, the multi-layer may remain as a memory layer 131A in the channel hole 130A, and remain as a dielectric layer 131B in the electrode hole 130B. In addition, the first semiconductor layer may remain as a first channel semiconductor layer 133A in the channel hole 130A, and remain as a first electrode semiconductor layer 133B in the electrode hole 130B. The insulating layer may remain as a channel core insulating layer 135A in the channel hole 130A, and remain as an electrode core insulating layer 135B in the electrode hole 130B.

Referring to FIG. 4E, an upper end of each of the channel core insulating layer 135A and the electrode core insulating layer 135B, which are shown in FIG. 4D. Subsequently, the region in which the channel core insulating layer 135A and the electrode core insulating layer 135B are removed may be filled with a second semiconductor layer. In an embodiment, the second semiconductor layer may include a doped silicon layer doped with an n-type impurity. The second semiconductor layer may be separated into a second channel semiconductor layer 137A surrounded by the first channel semiconductor layer 133A and a second electrode semiconductor layer 137B surrounded by the first electrode semiconductor layer 133B.

The first channel semiconductor layer 133A, the first channel core insulating layer 135A, and the second channel semiconductor layer 137A may constitute a channel structure 139A. In an embodiment different from that shown in the drawing, the channel structure 139A may include a semiconductor layer filling the central region of the channel hole 130A shown in FIG. 4D.

The first electrode semiconductor layer 133B, the first electrode core insulating layer 135B, and the second electrode semiconductor layer 137B may constitute a capacitor electrode 139B. In an embodiment different from that shown in the drawing, the capacitor electrode 139B may include a semiconductor layer filling the central region of the electrode hole 130B shown in FIG. 4D.

Figure 5:
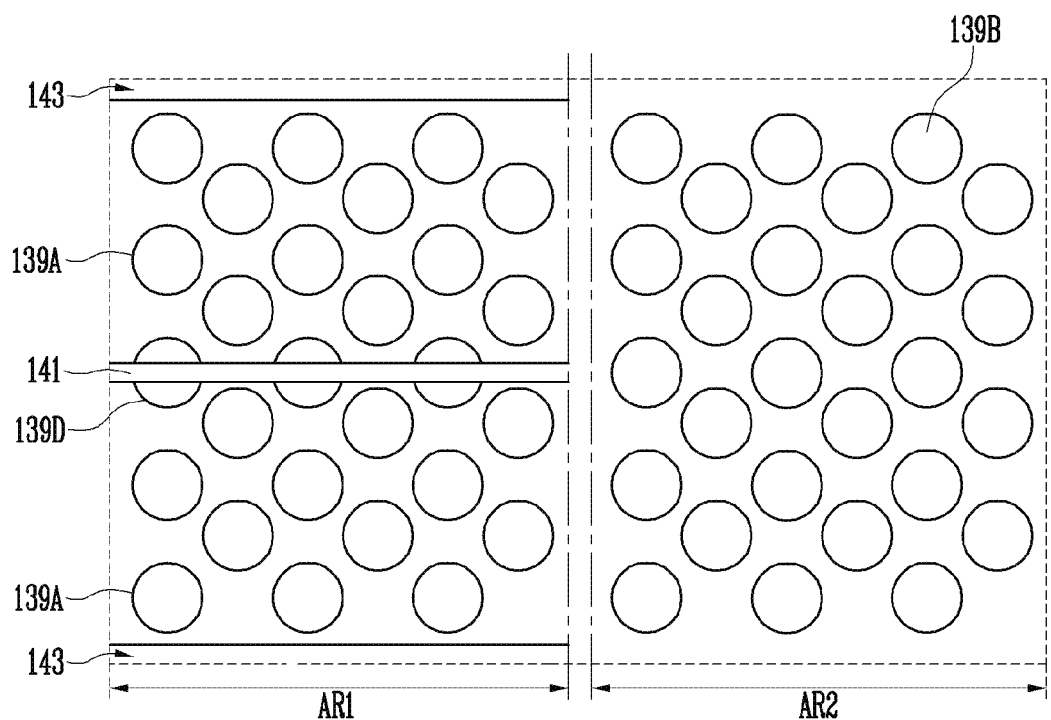

FIG. 5 is a plan view illustrating a select isolation structure 141 and a slit 143, which penetrate the first stack structure ST1 and the second stack structure ST2.

Referring to FIGS. 4E and 5, the select isolation structure 141 may be formed, which penetrates a portion of the second stack structure ST2 from an upper surface of the second stack structure ST2. The select isolation structure 141 may be formed of an insulating material. The select isolation structure 141 may overlap with dummy channel structures 139D penetrating the first stack structure ST1 and the second stack structure ST2. The dummy channel structures 139D may be simultaneously formed with the channel structures 139A. In another embodiment, the dummy channel structures 139D may be omitted.

Subsequently, the slit 143 may be formed, which penetrates the first stack structure ST1 and the second stack structure ST2. The slit 143 may overlap with the first lower structure 100a of the first region AR1. The capacitor electrode 139B may be spaced apart from the slit 143.

Figure 6B:
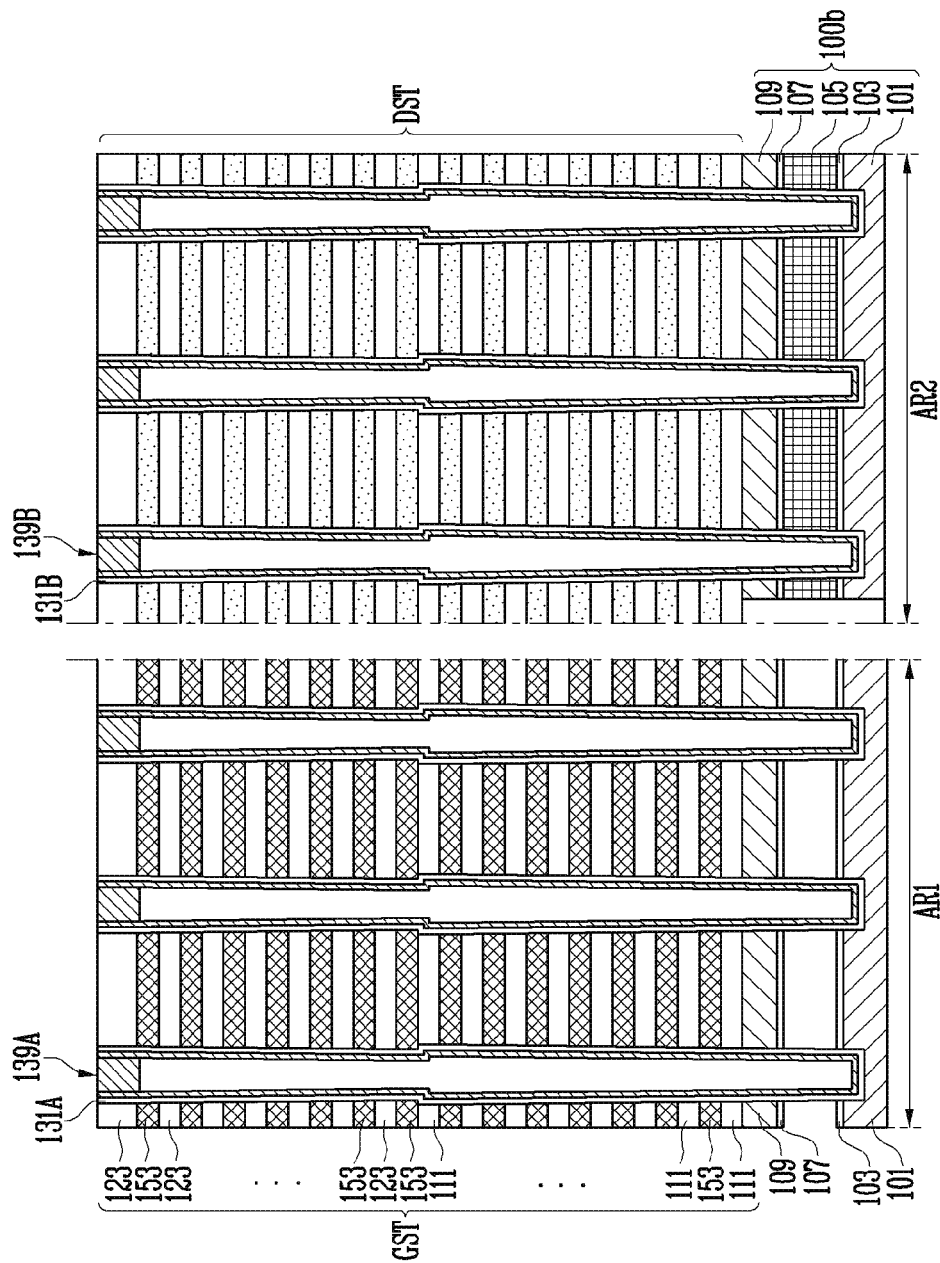

FIGS. 6A to 6C are sectional views illustrating subsequent processes continued after the step of forming the slit 143 shown in FIG. 5.

Referring to FIGS. 5 and 6A, a portion of each of the first and second sacrificial insulating layers overlapping with the first lower structure 100a may be removed through the slit 143. Accordingly, openings 151 are defined between the first and second interlayer insulating layers 111 and 123. The openings 151 overlap with the first lower structure 100a.

The first and second sacrificial insulating layers 113 and 121 and the first and second interlayer insulating layers 111 and 123, which overlap with the second lower structure 100b, may remain as a dielectric stack structure DST surrounding the capacitor electrode 139B.

Referring to FIGS. 5 and 6B, the openings 151 shown in FIG. 6A are filled with conductive patterns 153 through the slit 143. Accordingly, a gate stack structure GST may be formed, which overlaps with the first region AR1 of the lower structure.

The step of forming the conductive patterns 153 may include a step of introducing a conductive material through the slit 143 such that the openings 151 shown in FIG. 6A are filled and a step of removing a portion of the conductive material formed in the slit 143 through the slit 143 such that the conductive material is separated into the conductive patterns 153.

Subsequently, the sacrificial material layer 105 disposed in the first region AR1 of the lower structure may be removed through the slit 143. Although not shown in the drawing, a protective layer may be formed on a sidewall of the gate stack structure GST, before the sacrificial material layer 105 is removed.

When a portion of the sacrificial material layer 105 is removed, the memory layer 131A may be exposed.

Referring to FIGS. 5 and 6C, a portion of the memory layer, which is exposed due to the removal of the sacrificial material layer 105, may be etched, so that the memory layer is separated into a first memory pattern 131Aa and a second memory pattern 131Ab. In addition, a sidewall of the first channel semiconductor layer 133A may be exposed between the first memory pattern 131Aa and the second memory pattern 131Ab.

A portion of each of the first insulating layer 103 and the second insulating layer 107, which are disposed in the first region AR1 of the lower structure shown in FIG. 6B, may be removed, while the memory layer is being etched. Accordingly, the first lower semiconductor layer 101 and the second lower semiconductor layer 109, which are disposed in the first region AR1 of the lower structure, may be exposed.

Subsequently, a doped semiconductor layer 149 may be formed. The doped semiconductor layer 149 may be in direct contact with the exposed first channel semiconductor layer 133a, and the first lower semiconductor layer 101 and the second lower semiconductor layer 109, which are disposed in the first region AR1 of the lower structure. The doped semiconductor layer 149 may be used as the contact semiconductor layer CTS of the semiconductor stack structure STS described with reference to FIG. 3. The doped semiconductor layer 149 may include a source dopant. In an embodiment, the doped semiconductor layer 149 may include a silicon layer including an n-type impurity.

Subsequently, the slit 143 shown in FIG. 5 may be filled with an insulating material or be filled with a source contact plug. Subsequently, a first upper insulating layer 161 may be formed on the gate stack structure GST penetrated by the channel structure 139A and the dielectric stack structure DST penetrated by the capacitor electrode 139B. Subsequently, first connection patterns 163A and 163B penetrating the first upper insulating layer 161 may be formed. Subsequently, a second upper insulating layer 165 may be formed on the first upper insulating layer 161. Subsequently, second connection patterns 167A and 167B penetrating the second upper insulating layer 165 may be formed.

The first connection patterns 163A and 163B are formed of a conductive material. The first connection patterns 163A and 163B may include a first channel connection pattern 163A connected to the channel structure 139A and a first electrode connection pattern 163B connected to the capacitor electrode 139B.

The second connection patterns 167A and 167B are formed of a conductive material. The second connection patterns 167A and 167B may include a second channel connection pattern 167A connected to the first channel connection pattern 163A and a second electrode connection pattern 167B connected to the first electrode connection pattern 163B.

Subsequently, the bit lines BL1 and BL2 and the electrode lines L1 and L2, which are shown in FIGS. 1 and 3, may be formed.

The manufacturing method described with reference to FIGS. 4A to 4E, 5, and 6A to 6C may be used in manufacturing of the semiconductor memory device shown in FIG. 2.

FIGS. 7A to 7G are sectional views illustrating various embodiments of the capacitor structure. The embodiments shown in FIGS. 7A to 7G may be applied to a second region AR2 of a lower structure LS and a capacitor structure disposed on the top thereof.

Referring to FIGS. 7A to 7G, each of capacitor contact structures CCT may include a first electrode connection pattern A' penetrating a first upper insulating layer UI1 and a second electrode connection pattern B, as described with reference to FIG. 3. First electrode lines L1 and second electrode lines L2, which are connected to the capacitor contact structures CCT, may be arranged, as described with reference to FIG. 1 or 2.

A dielectric stack structure DST may include first material layers ILD' and second material layers SA1 to SAn, which are alternately stacked, as described with reference to FIG. 3. Capacitor electrodes CE may be respectively connected to the capacitor contact structures CCT, and extend to the inside of the dielectric stack structure DST.

Capacitor electrodes CE may be formed in various structures.

Figure 7A:
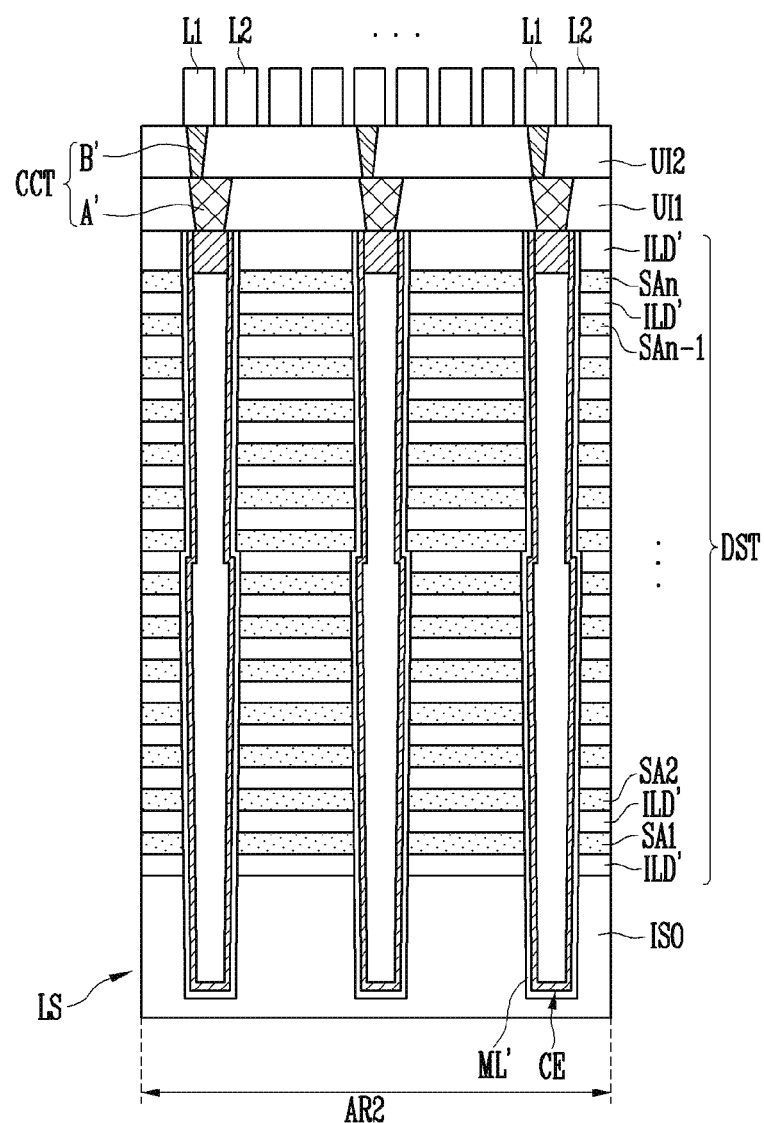
FIGS. 7A to 7G are sectional views illustrating various embodiments of the capacitor structure.

In an embodiment, as shown in FIG. 7A, each of the capacitor electrodes CE may be surrounded by a dielectric film ML', and include the same material layers as the capacitor electrodes CE described with reference to FIG. 3.

Figure 7B:
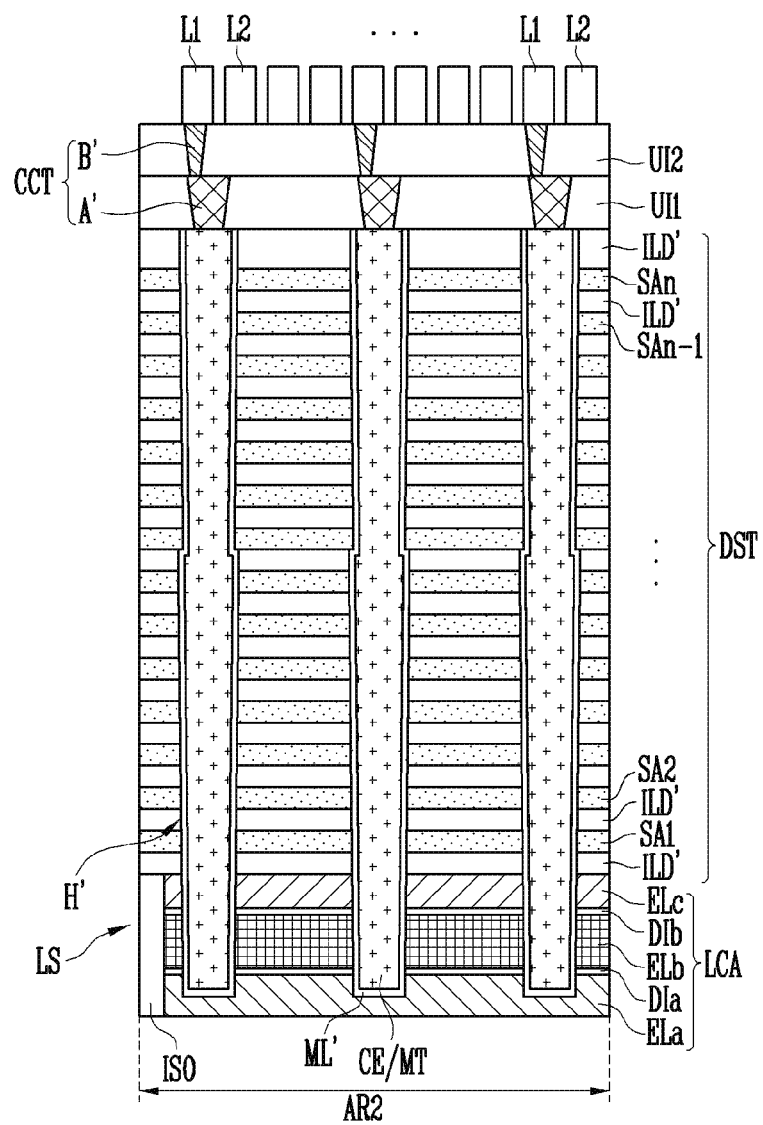
Figure 7C:
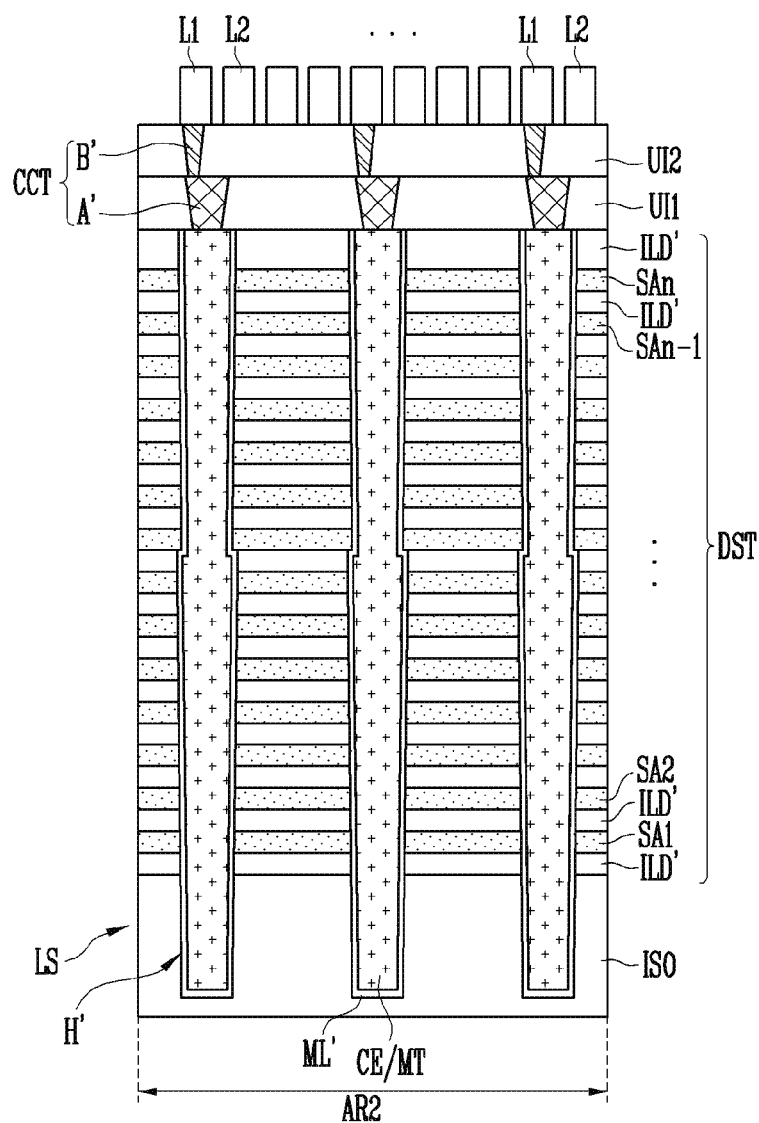

In an embodiment, as shown in FIGS. 7B and 7C, each of the capacitor electrodes CE may be disposed on the dielectric film ML' formed along a surface of an electrode hole H' penetrating the dielectric stack structure DST. Each of the capacitor electrodes CE may include a metal layer MT filling a central region of the electrode hole H', which is opened by the dielectric film ML'.

Figure 7D:
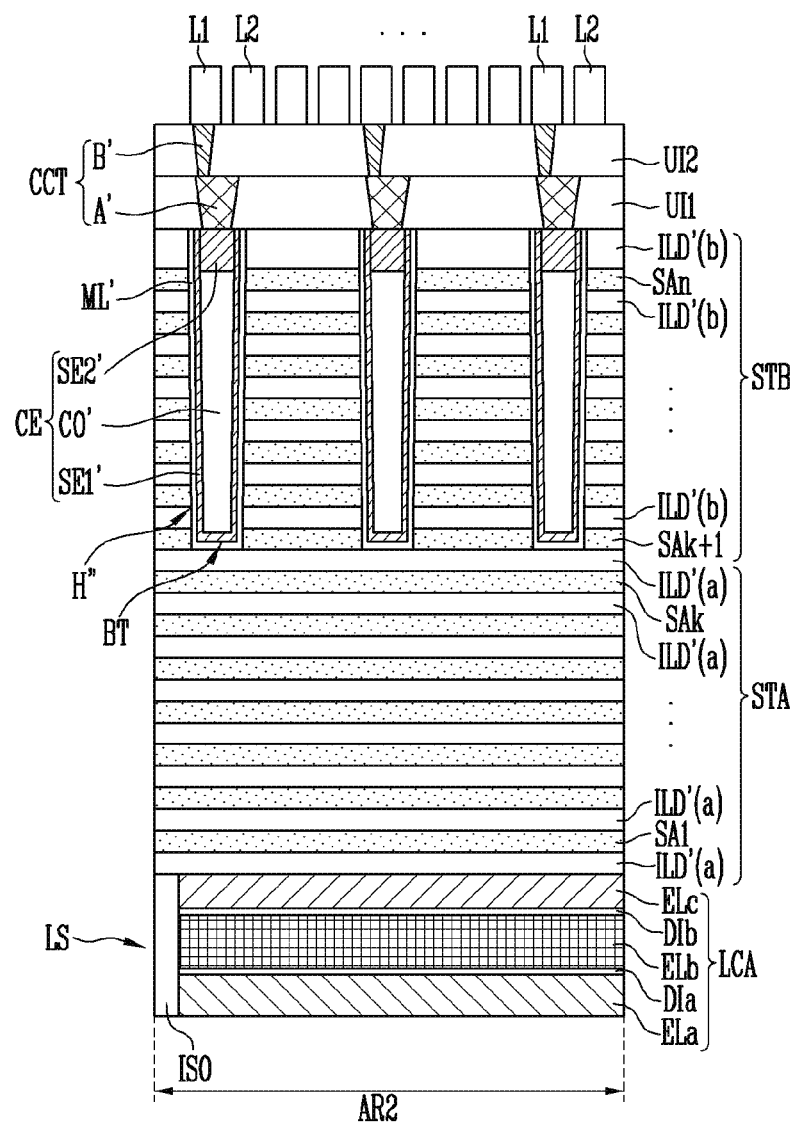
Figure 7E:
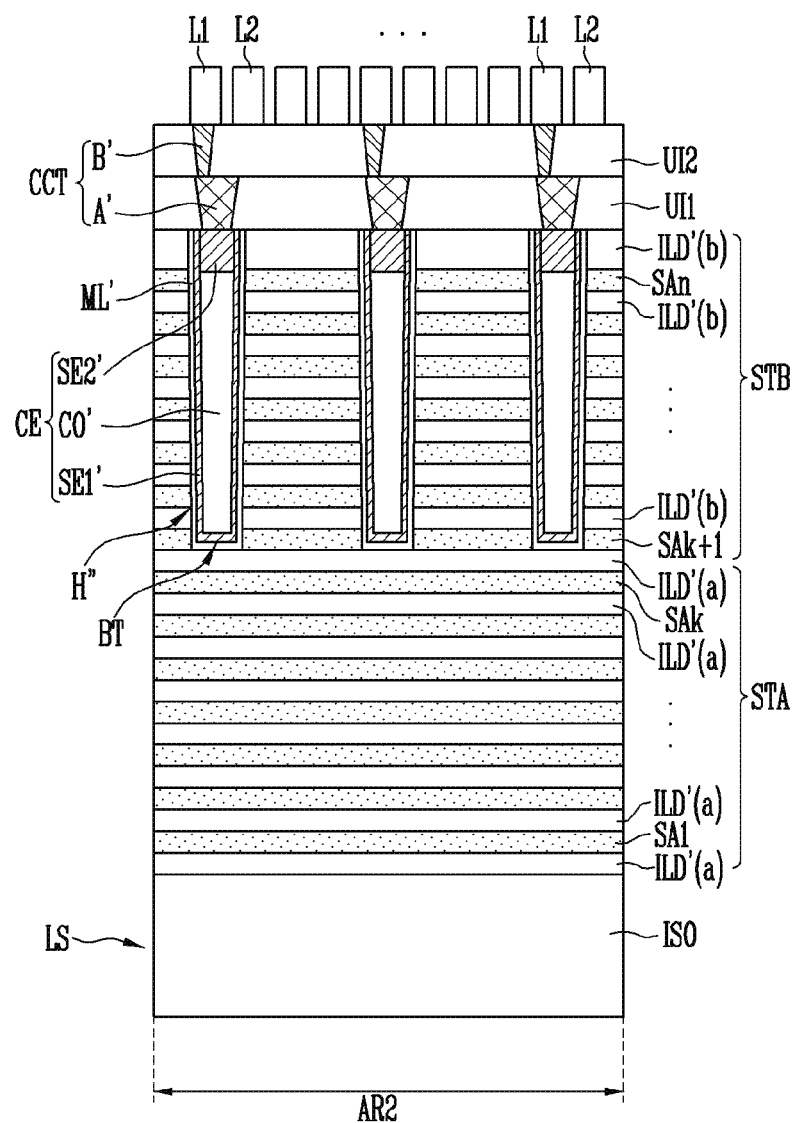
Figure 7F:
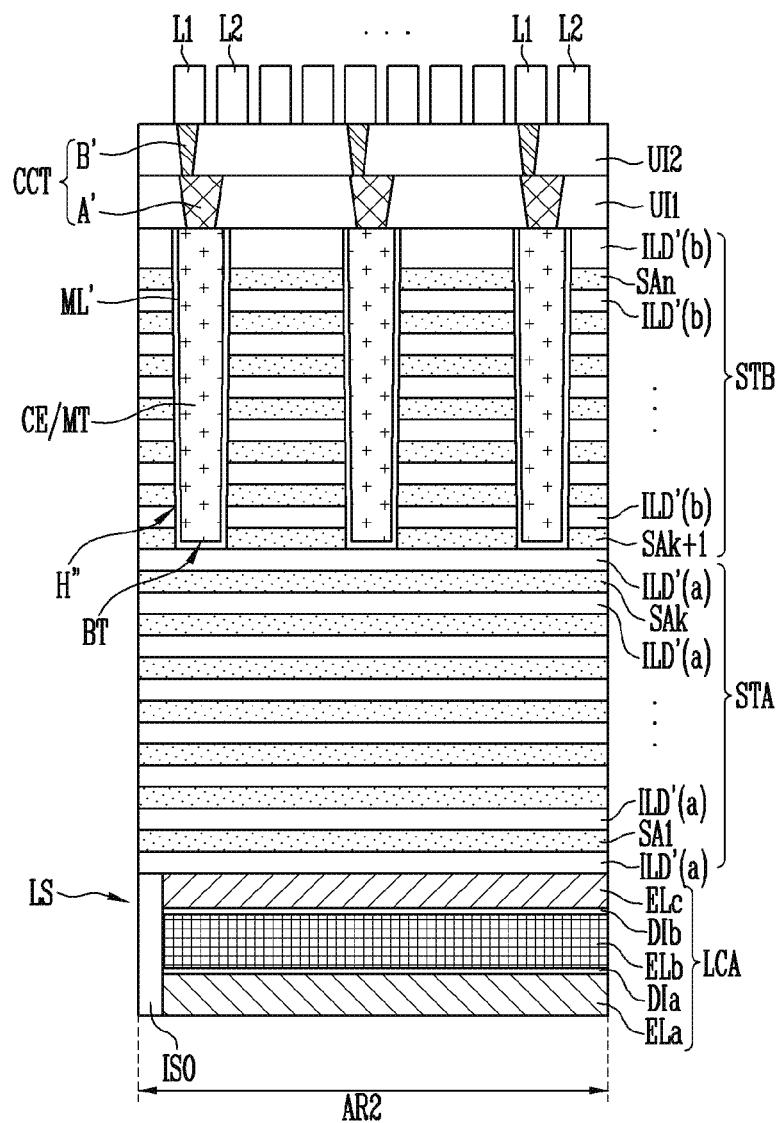
Figure 7G:
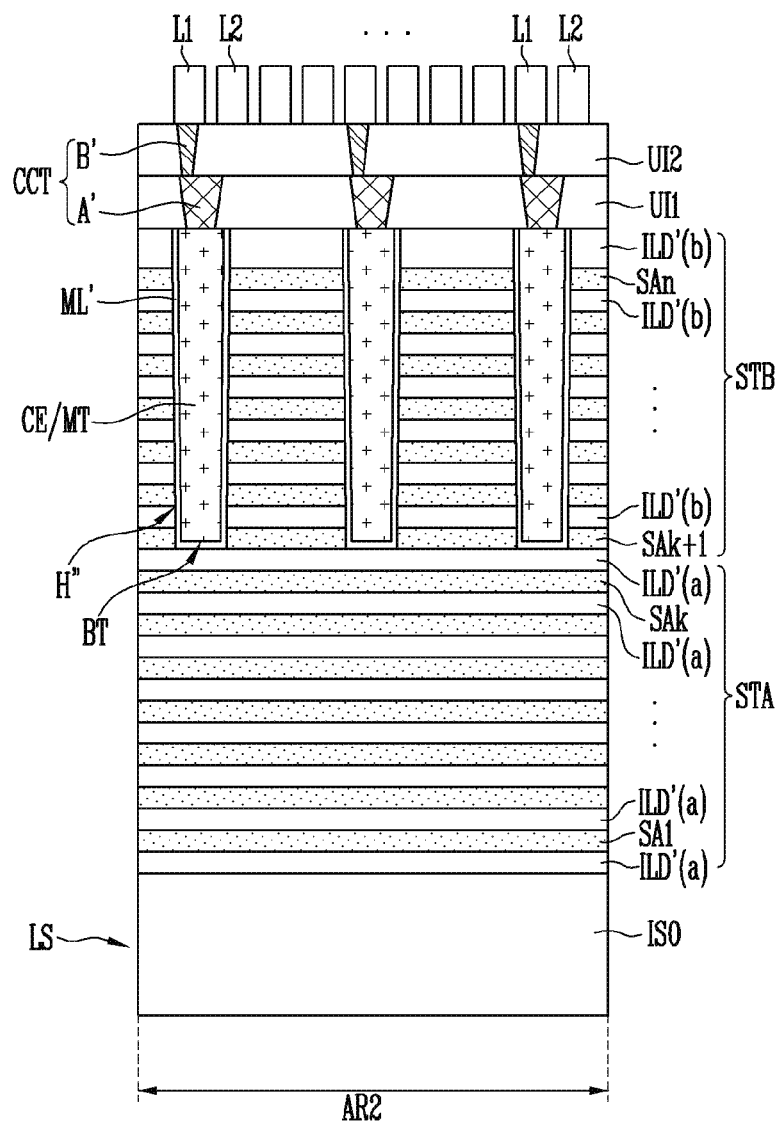

Referring to FIGS. 7D and 7G, each of the capacitor electrodes CE may be formed shorter than the channel structure CH shown in FIG. 3. For example, the dielectric stack structure DST may include a first dielectric stack structure STA disposed on the second region AR2 of the lower structure LS and a second dielectric stack structure STB disposed on the first dielectric stack structure STA. The first material layers ILD' may include first dummy insulating layers ILD'(a) constituting the first dielectric stack structure STA and second dummy insulating layer ILD'(b) constituting the second dielectric stack structure STB. The second material layers SA1 to SAn may include first sacrificial insulating layers SA1 to SAk constituting the first dielectric stack structure STA and second sacrificial insulating layers SAk+1 to SAn constituting the second dielectric stack structure STB. That is, the first dielectric stack structure STA may include the first dummy insulating layers ILD'(a) and the first sacrificial insulating layers SA1 to SAk, which are alternately stacked, and the second dielectric stack structure STB may include the second sacrificial insulating layers SAk+1 to SAn and the second dummy insulating layers ILD'(b), which are alternately stacked. As shown in FIGS. 7D to 7G, each of the capacitor electrodes CE may be formed in an electrode hole H" that penetrates the second dielectric stack structure STB and has a bottom surface overlapping with the first dielectric stack structure STA. Each of the capacitor electrodes CE may penetrate the second dielectric stack structure STB, and have a bottom surface BT facing the first dielectric stack structure STA.

Each of the capacitor electrodes CE disposed on the first dielectric stack structure STA may be surrounded by the dielectric film ML'. Each of the capacitor electrode CE disposed on the first dielectric stack structure STA may be formed in various structures.

Referring to FIGS. 7D and 7E, each of the capacitor electrodes CE may include a first electrode semiconductor layer SE1, an electrode core insulating layer CO, and a second electrode semiconductor layer SE2'. The first electrode semiconductor layer SE1, the electrode core insulating layer CO, and a second electrode semiconductor layer SE2' may be formed of the same materials as the first electrode semiconductor layer SE1, the electrode core insulating layer CO, and a second electrode semiconductor layer SE2', which are described with reference to FIG. 3. The first electrode semiconductor layer SE1' may be formed along a surface of the electrode hole H" defined in the second dielectric stack structure STB. The electrode core insulating layer CO' and a second electrode semiconductor layer SE2' may fill a central region of the electrode hole H", which is opened by the first electrode semiconductor layer SE1'.

Referring to FIGS. 7F and 7G, each of the capacitor electrodes CE may include the metal layer MT filling the central region of the hole H" defined in the second dielectric stack structure STB. The dielectric film ML' may extend along a sidewall and a bottom surface of the metal layer MT.

The second region AR2 of the lower structure LS shown in FIGS. 7A to 7G may be variously configured.

In some embodiments, as shown in FIGS. 7A, 7C, 7E, and 7G, the lower structure LS may include an isolation insulating layer ISO extending to overlap with the capacitor electrodes CE. The isolation insulating layer ISO may extend toward the second region AR2 of the lower structure LS from a sidewall of the semiconductor stack structure STS described with reference to FIG. 3. As shown in FIGS. 7A and 7C, the capacitor electrodes CE may extend to the inside of the isolation insulating layer ISO. As shown in FIGS. 7E and 7G, the capacitor electrodes CE may be spaced apart from the isolation insulating layer ISO by the first dielectric stack structure STA.

In another embodiment, as shown in FIGS. 7B, 7D, and 7F, the lower structure LS may include a lower capacitor structure LCA. The lower capacitor structure LCA may be insulated from the semiconductor stack structure STS described with reference to FIG. 3 by the isolation insulating layer ISO. The lower capacitor structure LCA may include a first lower electrode ELa, a first insulating layer DIa, a second lower electrode ELb, a second insulating layer DIb, and a third lower electrode ELc, as described with reference to FIG. 3. As shown in FIG. 7B, the capacitor electrodes CE may extend to the inside of the lower capacitor structure LCA. As shown in FIGS. 7D and 7F, the capacitor electrodes CE may be spaced apart from the lower capacitor structure LCA by the first dielectric stack structure STA.

Figure 8:
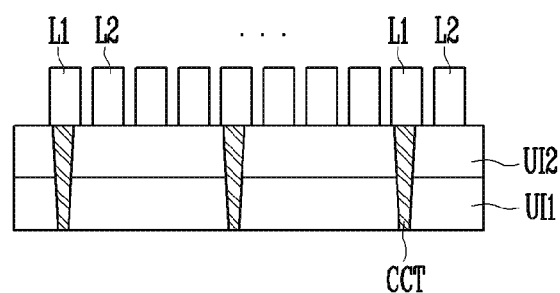
FIG. 8 is a sectional view illustrating an embodiment of a capacitor contact structure.

FIG. 8 is a sectional view illustrating an embodiment of a capacitor contact structure.

Referring to FIG. 8, the capacitor contact structure CCT may include a single connection pattern that penetrates the upper insulating layers UI1 and Ui2 overlapping with the electrode lines L1 and L2 and is connected to each of capacitor electrodes in accordance with various embodiments.

Figure 9:
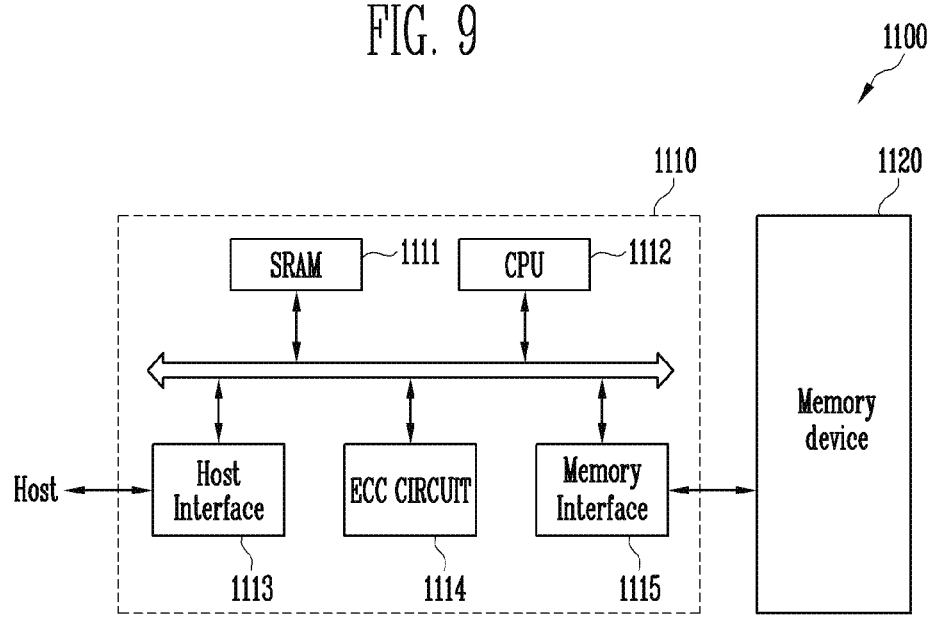
FIG. 9 is a block diagram illustrating a configuration of a memory system in accordance with an embodiment of the present disclosure.

FIG. 9 is a block diagram illustrating a configuration of a memory system in accordance with an embodiment of the present DISCLOSURE.

Referring to FIG. 9, the memory system 1100 in accordance with the embodiment of the present disclosure includes a memory device 1120 and a memory controller 1110.

The memory device 1120 may be a multi-chip package configured with a plurality of flash memory chips. The memory device 1120 may include at least one of the capacitor structures described with reference to FIGS. 1, 2, 3, 7A to 7G, and 8.

The memory controller 1110 is configured to control the memory device 1120, and may include a static random access memory (SRAM) 1111, a CPU 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 10:
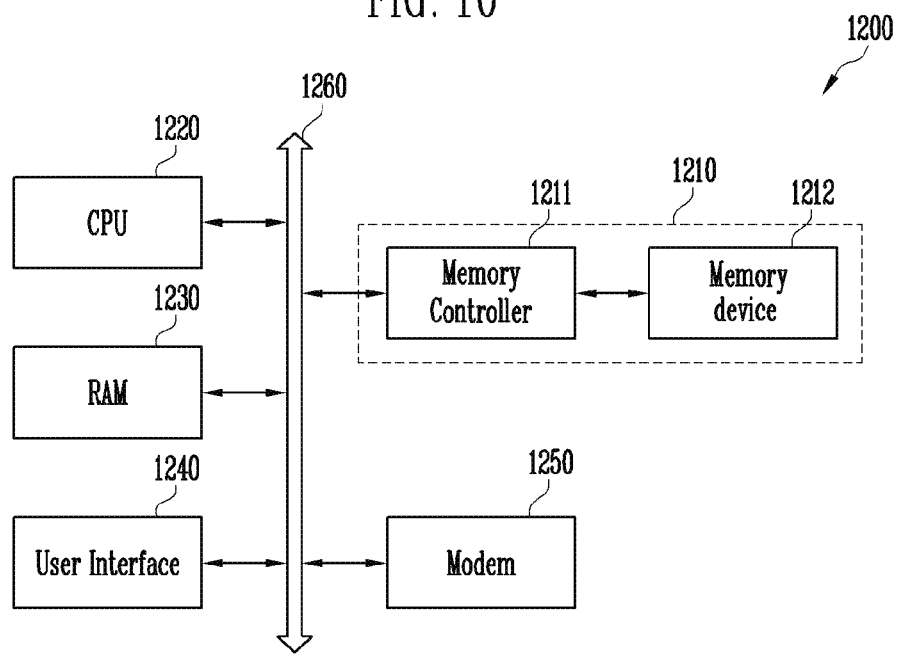
FIG. 10 is a block diagram illustrating a configuration of a computing system in accordance with an embodiment of the present disclosure.

FIG. 10 is a block diagram illustrating a configuration of a computing system in accordance with an embodiment of the present disclosure.

Referring to FIG. 10, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may include a memory device 1212 and a memory controller 1211.

In accordance with an embodiment, a capacitor structure may be formed using a dielectric stack structure that may remain in a process of manufacturing the semiconductor memory device and capacitor electrodes penetrating the dielectric stack structure, so that the capacitance of a capacitor can be increased.

What is claimed is:

1. A semiconductor memory device comprising:
a lower structure including a first region and a second region;
a gate stack structure including interlayer insulating layers and conductive patterns, which are alternately stacked in a vertical direction on the first region of the lower structure;
a channel structure penetrating the gate stack structure;
a dielectric stack structure including first material layers and second material layers, which are alternately stacked in the vertical direction on the second region of the lower structure; and
capacitor electrodes disposed in the dielectric stack structure, the capacitor electrodes extending substantially in parallel to the channel structure,
wherein the capacitor electrodes include:
first capacitor electrodes connected to a first electrode line to which a first voltage is applied; and
second capacitor electrodes connected to a second electrode line to which a second voltage lower than the first voltage is applied.

2. The semiconductor memory device of claim 1, comprising:
electrode lines disposed on the capacitor electrodes; and
capacitor contact structures extending toward the electrode lines from the capacitor electrodes.

3. The semiconductor memory device of claim 2, wherein the capacitor electrodes include odd-numbered capacitor electrodes and even-numbered capacitor electrodes, which are alternately arranged in an extending direction of the electrode lines,
wherein the electrode lines include the first electrode line and the second electrode line, which overlap with the odd-numbered capacitor electrodes and the even-numbered capacitor electrode, which are arranged in a line along the extending direction.

4. The semiconductor memory device of claim 3, wherein the capacitor contact structures include:
first capacitor contact structures connecting the first electrode line to the odd-numbered capacitor electrodes; and
second capacitor contact structures connecting the second electrode line to the even-numbered capacitor electrodes.

5. The semiconductor memory device of claim 4, wherein the first capacitor contact structures and the second capacitor contact structures are disposed in a zigzag pattern.

6. The semiconductor memory device of claim 2, further comprising:
a bit line disposed at the same level as the electrode lines on the channel structure; and
a bit contact structure extending toward the bit line from the channel structure.

7. The semiconductor memory device of claim 1, wherein the first material layers include first dummy insulating layers and second dummy insulating layers, which are formed of the same material as the interlayer insulating layers, and
the second material layers include first sacrificial insulating layers and second sacrificial insulating layers, which are formed of a material different from that of the interlayer insulating layers,
wherein the dielectric stack structure is configured with a first stack structure including the first dummy insulating layers and the first sacrificial insulating layers, which are alternately stacked in the vertical direction on the lower structure, and a second stack structure including the second dummy insulating layers and the second sacrificial insulating layers, which are alternately stacked in the vertical direction on the first stack structure.

8. The semiconductor memory device of claim 7, wherein the capacitor electrodes penetrate the second stack structure and the first stack structure.

9. The semiconductor memory device of claim 7, wherein each of the capacitor electrodes has a bottom surface facing the first stack structure, and penetrates the second stack structure.

10. The semiconductor memory device of claim 1, wherein each of the capacitor electrodes includes:
- a first semiconductor layer formed along a surface of a hole defined in the dielectric stack structure;
- a core insulating layer filling a central region of the hole, which is opened by the first semiconductor layer; and
- a second semiconductor layer filling the central region of the hole on the core insulating layer.

11. The semiconductor memory device of claim 1, wherein each of the capacitor electrodes includes a metal layer filling a hole defined in the dielectric stack structure.

12. The semiconductor memory device of claim 1, wherein the lower structure includes:
- a semiconductor stack structure overlapping with the gate stack structure, the semiconductor stack structure being connected to the channel structure; and
- a lower capacitor structure spaced apart from the semiconductor stack structure, the lower capacitor structure overlapping with the dielectric stack structure.

13. The semiconductor memory device of claim 12, wherein the lower capacitor structure includes a first lower electrode, a first insulating layer, a second lower electrode, and a second insulating layer, which are sequentially stacked in the vertical direction.

14. The semiconductor memory device of claim 12, wherein the lower capacitor structure includes a first lower electrode, a first insulating layer, a second lower electrode, a second insulating layer, and a third lower electrode, which are sequentially stacked in the vertical direction.

15. The semiconductor memory device of claim 14, wherein the capacitor electrodes penetrate the third lower electrode, the second insulating layer, the second lower electrode, and the first insulating layer, and extend to the inside of the first lower electrode.

16. The semiconductor memory device of claim 15, further comprising a dielectric film surrounding each of the capacitor electrodes.

17. The semiconductor memory device of claim 1, wherein the lower structure includes:
- a semiconductor stack structure overlapping with the gate stack structure, the semiconductor stack structure being connected to the channel structure; and
- an isolation insulating layer disposed on a sidewall of the semiconductor stack structure, the isolation insulating layer extending to overlap with the dielectric stack structure.

18. A semiconductor memory device comprising:
- a first dielectric stack structure including first dummy insulating layers and first sacrificial insulating layers, which are alternately stacked in a vertical direction;
- a second dielectric stack structure including second dummy insulating layers and the second sacrificial insulating layers, which are alternately stacked in the vertical direction on the first dielectric stack structure; and
- capacitor electrodes extending in the vertical direction to penetrate the second dielectric stack, wherein the capacitor electrodes include:

first capacitor electrodes connected to a first electrode line to which a first voltage is applied; and second capacitor electrodes connected to a second electrode line to which a second voltage lower than the first voltage is applied.

19. The semiconductor memory device of claim 18, wherein the capacitor electrodes extend to penetrate the first dielectric stack structure.

20. The semiconductor memory device of claim 18, further comprising:
- conductive patterns disposed at levels identical to levels at which the first and second sacrificial insulating layers are disposed, the conductive patterns being stacked to be spaced apart from each other in the vertical direction;
- a channel structure penetrating the conductive patterns; and
- a memory layer surrounding a sidewall of the channel structure.

* * * * *